(12) United States Patent
Yu et al.

(10) Patent No.: US 12,514,021 B2
(45) Date of Patent: *Dec. 30, 2025

(54) SOLAR CELL, MANUFACTURING METHOD THEREOF, AND PHOTOVOLTAIC MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Kun Yu, Zhejiang (CN); Changming Liu, Zhejiang (CN); Xinyu Zhang, Zhejiang (CN)

(73) Assignees: SHANGHAI JINKO GREEN ENERGY ENTERPRISE MANAGEMENT CO., LTD., Shanghai (CN); ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/888,868

(22) Filed: Sep. 18, 2024

(65) Prior Publication Data
US 2025/0048774 A1   Feb. 6, 2025

Related U.S. Application Data

(60) Continuation of application No. 18/367,235, filed on Sep. 12, 2023, now Pat. No. 12,132,138, which is a
(Continued)

(30) Foreign Application Priority Data

Aug. 4, 2021   (CN) .......................... 202110895225.8

(51) Int. Cl.
*H10F 71/00*   (2025.01)
*H10F 10/14*   (2025.01)
(Continued)

(52) U.S. Cl.
CPC ............ *H10F 71/129* (2025.01); *H10F 10/14* (2025.01); *H10F 71/1224* (2025.01); *H10F 77/1645* (2025.01); *H10F 77/707* (2025.01)

(58) Field of Classification Search
CPC ...... H10F 10/14; H10F 10/146; H10F 71/121; H10F 71/1224; H10F 71/129;
(Continued)

(56) References Cited

U.S. PATENT DOCUMENTS 9,893,215 B2   2/2018   Schmidt et al.
10,014,419 B2   7/2018   Ha et al.
(Continued)

FOREIGN PATENT DOCUMENTS

CN   1780727 A   5/2006
CN   102484168 A   5/2012
(Continued)

OTHER PUBLICATIONS

Chinese Grant of Patent for Application No. 202211229358.2 with English Translation, mailed Apr. 28, 2025, (5 pages).
(Continued)

*Primary Examiner* — Golam Mowla
(74) *Attorney, Agent, or Firm* — NIXON PEABODY LLP; Jeffrey L. Costellia

(57) ABSTRACT

A solar cell includes a semiconductor substrate, in which a rear surface of the semiconductor substrate having non-pyramid-shaped microstructures, the non-pyramid-shaped microstructures include two or more first substructures at least partially stacked on one another, and a one-dimensional size of the surface of the outermost first substructure is less than or equal to 45 μm; a first passivation layer located on a front surface of the semiconductor substrate; first and second tunnel oxide layers located on the non-pyramid-shaped microstructures; first and second doped conductive
(Continued)

layers located on a surface of the first and second tunnel oxide layers, the first and second doped conductive layer has different conductive types; a second passivation layer located on a surface of the first and second doped conductive layers; and electrodes formed by penetrating through the second passivation layer to be in contact with the first and second doped conductive layers.

20 Claims, 6 Drawing Sheets

Related U.S. Application Data continuation of application No. 18/071,430, filed on Nov. 29, 2022, now Pat. No. 11,843,071, which is a continuation-in-part of application No. 17/964,190, filed on Oct. 12, 2022, now Pat. No. 11,824,136, which is a division of application No. 17/459,689, filed on Aug. 27, 2021, now Pat. No. 11,581,454.

(51) Int. Cl.
  *H10F 77/164* (2025.01)
  *H10F 77/70* (2025.01)
(58) Field of Classification Search
  CPC .. H10F 77/1645; H10F 77/211; H10F 77/703; H10F 77/707
  See application file for complete search history.

(56) References Cited

U.S. PATENT DOCUMENTS

| | | |
|---|---|---|
| 10,522,707 B2 | 12/2019 | Gibson et al. |
| 2013/0153025 A1 | 6/2013 | Hahn et al. |
| 2015/0102212 A1 | 4/2015 | Ruh |
| 2015/0162487 A1 | 6/2015 | Deshazer et al. |
| 2016/0225924 A1 | 8/2016 | Kwan et al. |
| 2016/0351737 A1 | 12/2016 | Chung et al. |
| 2017/0179325 A1 | 6/2017 | Chung et al. |
| 2018/0018295 A1 | 1/2018 | Chen et al. |
| 2018/0182905 A1 | 6/2018 | Nam et al. |
| 2018/0277701 A1 | 9/2018 | Lenes et al. |
| 2018/0315866 A1 | 11/2018 | Cheong et al. |
| 2019/0207040 A1 | 7/2019 | Harrington et al. |

FOREIGN PATENT DOCUMENTS

| | | |
|---|---|---|
| CN | 102683439 | 9/2012 |
| CN | 103325871 | 9/2013 |
| CN | 104103699 A | 10/2014 |
| CN | 104350607 | 2/2015 |
| CN | 105655427 A | 6/2016 |
| CN | 105789343 A | 7/2016 |
| CN | 105826405 | 8/2016 |
| CN | 105826411 A | 8/2016 |
| CN | 105914249 A | 8/2016 |
| CN | 107904663 A | 4/2018 |
| CN | 108400173 A | 8/2018 |
| CN | 108963013 | 12/2018 |
| CN | 109545880 | 3/2019 |
| CN | 110021681 A | 7/2019 |
| CN | 110197858 A | 9/2019 |
| CN | 110660883 A | 1/2020 |
| CN | 110797434 A | 2/2020 |
| CN | 110931596 | 3/2020 |
| CN | 111015369 A | 4/2020 |
| CN | 111180538 | 5/2020 |
| CN | 111341881 A | 6/2020 |
| CN | 111560249 A | 8/2020 |
| CN | 111628049 | 9/2020 |
| CN | 111640824 A | 9/2020 |
| CN | 111668345 A | 9/2020 |
| CN | 111739984 A | 10/2020 |
| CN | 111834476 A | 10/2020 |
| CN | 112111279 A | 12/2020 |
| CN | 112186069 A | 1/2021 |
| CN | 112259614 A | 1/2021 |
| CN | 112309849 A | 2/2021 |
| CN | 112466962 A | 3/2021 |
| CN | 212750903 | 3/2021 |
| CN | 112599615 | 4/2021 |
| CN | 112635591 A | 4/2021 |
| CN | 113035978 A | 6/2021 |
| EP | 2149915 | 2/2010 |
| EP | 2471109 B1 | 10/2013 |
| EP | 2645421 | 10/2013 |
| EP | 3358627 A1 | 8/2018 |
| EP | 3017520 B1 | 10/2020 |
| EP | 4131425 A1 | 2/2023 |
| EP | 4372829 A2 | 5/2024 |
| EP | 4372829 B1 | 2/2025 |
| JP | 06-61515 | 3/1994 |
| JP | 2004-273829 | 9/2004 |
| JP | 2011129867 A | 6/2011 |
| JP | 2012-216788 | 11/2012 |
| JP | 2015531550 A | 11/2015 |
| JP | 2016506077 A | 2/2016 |
| JP | 2018037549 A | 3/2018 |
| JP | 6746854 | 8/2020 |
| KR | 2012-0080583 | 7/2012 |
| KR | 2018-0058099 | 5/2018 |
| KR | 2019-0058017 | 5/2019 |
| WO | 2013-098955 A1 | 7/2013 |
| WO | WO-2013/186945 | 12/2013 |
| WO | WO-2015/122257 | 8/2015 |
| WO | 2016-114271 A1 | 7/2016 |
| WO | WO-2016/129481 | 8/2016 |
| WO | 2018084159 A1 | 5/2018 |

OTHER PUBLICATIONS

Japanese Office Action for Application No. 2024-228550 with English Translation, mailed Apr. 8, 2025 (16 pages).
Japanese Notice of Reasons for Refusal for Application No. 2021-137285, mailed Jan. 11, 2022 (17 pages).
Japanese Notification of Reasons for Refusal for Application No. 2022-084397, mailed Aug. 2, 2022 (4 pages).
Australian Notice of Acceptance for Application No. 2021225144, mailed Jun. 10, 2022 (6 pages).
Extended European Search Report for Application No. 21194044.0, mailed Dec. 2, 2021, (7 pages).
Chinese Office Action for Application No. 202110895225.8, mailed Dec. 5, 2022 (14 pages).
U.S. Notice of Allowance for U.S. Appl. No. 17/459,689, dated Oct. 31, 2022, (12 pages).
U.S. Corrected Notice of Allowability for U.S. Appl. No. 17/964,190, dated Aug. 30, 2023, (8 pages).
Japanese Office Action for Application No. 2022-176074, mailed Apr. 11, 2023 (4 pages).
U.S. Non-Final Office Action for U.S. Appl. No. 18/071,430, dated Jun. 30, 2023 (11 Pages).
Japanese Notice of Reasons for Refusal for Application No. 2023-129723, mailed Dec. 5, 2023 (6 pages).
Japanese Grant of Patent for Application No. 2023-129723, mailed Dec. 3, 2024 (5 pages).
Rentsch et al., "Challenges for Single-Side Chemical Processing," Photovoltaics International, Sixth Edition, May 2012, (5 pp.).
Pang, "Process Study of Trough Type Wet Method Alkaline Polishing of PERC Solar Cells," Journal of Synthetic Crystals, vol. 48, No. 1, pp. 178-184, (Jan. 2019)—English Abstract.
Kafle et al., "TOPcon—Technology Options for Cost Efficient Industrial Manufacturing," Solar Energy Materials and Solar Cells, No. 227, (2021).
Kim et al., "The Effect of Rear Surface Polishing to the Performance of Thin Crystalline Silicon Solar Cells," Solar Energy, No. 85, pp. 1085-1090, (2011).

(56) References Cited

OTHER PUBLICATIONS

Wei et al., "Research on KOH Alkaline Etching Process of Monocrystalline Silicon Piece," Energy and Energy Conservation, Jan. 2020, 172, pp. 129-131, English Abstract.
Wang et al., "The solar cell back-side polishing process study based on TMAH.", Journal of Functional Materials, Jul. 30, 2015, vol. 46, No. 14, pp. 14127-14129, 14133, English Abstract.
Xin LV, "Study on Topcon N-Pert Double-Sided Solar Cell Technology," Microelectronics and Solid State Electronics major, Xi'an University of Technology, Master's Degree Paper, English Abstract.
Wenija et al., "Study of Rear Surface Treatment for Perl Silicon Solar Cell," Acta Energiae Solaris Sinica, Oct. 2016, vol. 37, No. 10, pp. 2460-2466, English Abstract.
Handbook of Photovoltaic Science and Engineering edited by A. Lugue and S. Hegedus, 2003, John Wiley & Sons, Ltd.

SOLAR CELL, MANUFACTURING METHOD THEREOF, AND PHOTOVOLTAIC MODULE

CROSS-REFERENCE TO RELATED APPLICATIONS

The present application is a continuation of U.S. application Ser. No. 18/367,235, filed on Sep. 12, 2023, which is a continuation of U.S. application Ser. No. 18/071,430, filed on Nov. 29, 2022, which is a continuation in part of U.S. application Ser. No. 17/459,689, filed on Aug. 27, 2021, which claims priority to Chinese Patent Application No. 202110895225.8, filed on Aug. 4, 2021, the contents of which are incorporated herein by reference in their entireties.

TECHNICAL FIELD

The present disclosure relates to the field of photovoltaic cell technologies, and in particular, to a solar cell, a manufacturing method thereof, and a photovoltaic module.

BACKGROUND

An N-type tunnel oxide passivated contact (TOPCon) solar cell relies on a "tunnel effect" to achieve passivated contact on a rear surface of the solar cell. When manufacturing the TOPCon solar cell, borosilicate glass is formed by boron diffusion on a surface of a silicon wafer (or a substrate), which is more difficult to be removed compared with phosphorosilicate glass of a conventional PERC solar cell. Generally, borosilicate glass on a rear surface of an N-type solar cell is removed by an oxidizing mixed acid solution. After the surface is cleaned and dried, the rear surface is polished with the aid of a trough or chain acid additive. The polished rear surface of the silicon wafer has a flat structure, but the structure of the polished rear surface may directly affect the manufacturing of the tunnel oxide layer and the polycrystalline silicon layer, and then affect passivation performance and conversion efficiency of the solar cell.

SUMMARY

In view of the above, the present disclosure provides a solar cell, a manufacturing method thereof, and a photovoltaic module, which, through matching between texture structures on substrate surfaces of the solar cell, can improve an open-circuit voltage of the solar cell, reduce contact resistance of a metal electrode, and improve conversion efficiency of the solar cell.

In a first aspect, the present disclosure provides a solar cell, including: a semiconductor substrate, a rear surface of the semiconductor substrate includes non-pyramid-shaped microstructures which include two or more first substructures at least partially stacked on one another, a surface of the first substructure is a polygonal plane, and a one-dimensional size of the surface of the outermost first substructure is less than or equal to 45 µm; a first passivation layer located on a front surface of the semiconductor substrate; a first tunnel oxide layer and a second tunnel oxide layer located on non-pyramid-shaped microstructures of the rear surface of the semiconductor substrate; a first doped conductive layer located on a surface of the first tunnel oxide layer, and a second doped conductive layer located on a surface of the second tunnel oxide layer, the first doped conductive layer has a conductive type different from the second doped conductive layer; a second passivation layer located on a surface of the first and second doped conductive layers; and electrodes formed by penetrating through the second passivation layer to be in contact with the first and second doped conductive layers.

In one or more embodiments, the front surface of the semiconductor substrate includes pyramid-shaped microstructures, the pyramid-shaped microstructures include a top portion away from the front surface of the semiconductor substrate and a bottom portion close to the front surface of the semiconductor substrate, and in a direction away from the front surface and perpendicular to the front surface, a distance between the top portion and the bottom portion of the pyramid-shaped microstructures is less than or equal to 5 µm.

In one or more embodiments, the first doped conductive layer and the second doped conductive layer are spaced from each other by a separation region.

In one or more embodiments, the electrode includes a first type electrode electrically connected to the first doped conductive layer and a second type electrode electrically connected to the second doped conductive layer.

In one or more first substructures at least partially stacked on one another, in the direction away from the rear surface and perpendicular to the rear surface, a distance between the surface of the outermost first substructure and the surface of the adjacent first substructure is equal to or less than 2 µm.

In one or more embodiments, a shape of the polygonal plane of the first substructure includes at least one of a diamond, a square, a trapezoid, a substantially diamond, a substantially square or a substantially trapezoid.

In one or more embodiments, the non-pyramid-shaped microstructures further include two or more adjacent second substructures that do not stacked on one another, and a one-dimensional size of a surface of the second substructure away from the rear surface is less than or equal to 45 µm.

In one or more embodiments, the surface of the second substructure is a polygonal plane.

In one or more embodiments, a shape of the polygonal plane of the second substructure includes at least one of a diamond, a square, a trapezoid, a substantially diamond, a substantially square or a substantially trapezoid.

In one or more embodiments, the second passivation layer includes at least one of a silicon nitride layer, a silicon oxide layer or a silicon oxynitride layer.

In one or more embodiments, the second passivation layer has a thickness ranging from 70 nm to 120 nm.

In one or more embodiments, the first passivation layer includes at least one of a silicon oxide layer, a silicon nitride layer, an aluminum oxide layer or a silicon oxynitride layer, the first passivation layer has a thickness ranging from 10 nm to 120 nm.

In one or more embodiments, the first passivation layer is a stacked layer of an aluminum oxide layer, a silicon nitride layer and a silicon oxynitride layer.

In one or more embodiments, the aluminum oxide layer has a thickness ranging from 2 nm to 10 nm.

In one or more embodiments, the silicon nitride layer has a thickness ranging from 40 nm to 80 nm.

In one or more embodiments, the silicon oxynitride layer has a thickness ranging from 10 nm to 60 nm.

In one or more embodiments, the first tunnel oxide layer or the second tunnel oxide layer includes at least one of a silicon oxide layer, an aluminum oxide layer, a silicon oxynitride layer, a molybdenum oxide layer or a hafnium oxide layer.

In one or more embodiments, the first tunnel oxide layer or the second tunnel oxide layer has a thickness ranging from 0.8 nm to 2 nm.

In one or more embodiments, a band gap width of the first tunnel oxide layer or the second tunnel oxide layer is greater than 3.0 eV.

In a second aspect, the present disclosure provides a photovoltaic module, including a plurality of solar cell strings, each of the plurality of solar cell strings including the solar cell described in the first aspect.

BRIEF DESCRIPTION OF DRAWINGS

In order to better illustrate the technical solutions in embodiments of the present disclosure or the prior art, the accompanying drawings used in the description of the embodiments or the prior art will be briefly introduced below. It is apparent that, the accompanying drawings in the following description are only some embodiments of the present disclosure, and other drawings can be obtained by those of ordinary skill in the art from the provided drawings without creative efforts.

DESCRIPTION OF EMBODIMENTS

Figure 1:
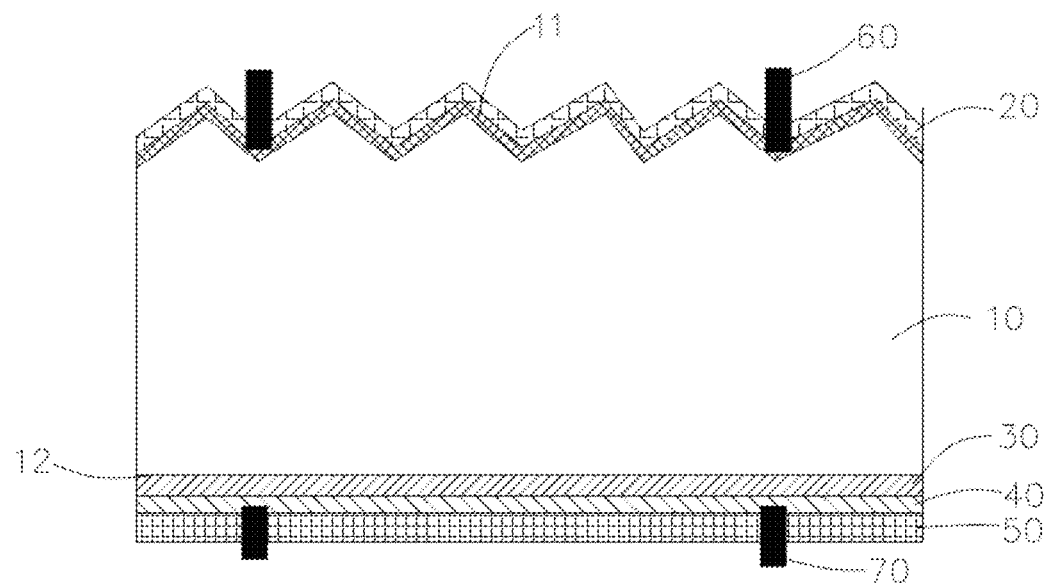
FIG. 1 is a schematic structural diagram of a solar cell according to an embodiment of the present disclosure.

In order to better understand the technical solutions of the present disclosure, the embodiments of the present disclosure are described in detail below with reference to the accompanying drawings.

It shall be made clear that the embodiments described are merely some embodiments rather than all of the embodiments of the present disclosure. All other embodiments obtained by those of ordinary skill in the art without creative efforts based on the embodiments of the present disclosure shall fall within the protection scope of the present disclosure.

The terms used in the embodiments of the present disclosure are merely for the purpose of describing particular embodiments and are not intended to limit the present disclosure. As used in the embodiments of the present disclosure and the appended claims, the singular forms of "a/an", "one", and "the" are also intended to include plural forms, unless otherwise clearly specified by the context.

It shall be understood that the term "and/or" used herein describes only an association relationship between associated objects and indicates that three relationships may exist. For example, A and/or B may indicate the following three cases: only A exists, both A and B exist, and only B exists. In addition, the character "/" generally indicates an "or" relationship between the associated objects.

The TOPCon solar cell relies on a "tunnel effect" to passivate the rear surface. An existing TOPCon solar cell rear surface structure sequentially includes a semiconductor substrate, a tunnel oxide layer, a doped conductive layer and a passivation layer on the rear surface from the inside out. Borosilicate glass (BSG) can be formed by in boron diffusion for an N-type TOPCon solar cell, which is more difficult to be removed than phosphoro silicate glass (PSG). Generally, the borosilicate glass is removed by an oxidizing mixed acid solution. The rear surface is polished after the surface is cleaned and dried. Currently, a state of the rear surface of the semiconductor substrate after polishing has a certain effect on an ultra-thin tunnel oxide layer with a nanometer thickness, which easily leads to an increase in contact resistivity between the tunnel oxide layer and the semiconductor substrate, which in turn leads to the fluctuation of a fill factor of the solar cell, and finally affects the photoelectric conversion efficiency of the solar cell.

In some embodiments, the TOPCon concept can be used in another high efficiency solar cell, such as IBC (Interdigitated Back Contact)) solar cell. For a typical IBC solar cell, a plurality of electrodes are disposed on a rear surface of a substrate of the IBC solar cell. The plurality of electrodes include multiple P-type electrodes electrically connected to corresponding P-type doped conductive layers and multiple N-type electrodes electrically connected to corresponding N-type doped conductive layers. In some embodiments, the P-type doped conductive layers include at least one first tunnel oxide layer (e.g., a first thin silicon oxide layer) and at least one P-type doped conductive layer (e.g., a P-type doped polysilicon layer). The N-type doped conductive layers include at least one second tunnel oxide layer (e.g., a second thin silicon oxide layer) and at least one P-type doped conductive layer (e.g., an N-type doped polysilicon layer). In some cases, the first tunnel oxide layer and the second tunnel oxide layer can be provided by a single process, for example, a single oxidation process.

In a first aspect, the present disclosure provides a solar cell. In some embodiments, the solar cell may be TOPCon solar cell. In some embodiments, the solar cell may be IBC solar cell. Merely for illustration, as shown in FIG. 1, the solar cell includes: a semiconductor substrate 10, a first passivation layer 20 located on a front surface of the semiconductor substrate 10, a tunnel oxide layer 30 located on the first texture structure of a rear surface of the semiconductor substrate 10, a doped conductive layer 40 located on a surface of the tunnel oxide layer 30, and a second passivation layer 50 located on a surface of the doped conductive layer 40. The rear surface of the semiconductor substrate 10 has a first texture structure 12, and the first texture structure 12 includes two or more first substructures that are at least partially stacked on one another. In a direction away from the rear surface and perpendicular to the rear surface, a distance between a top surface of the outermost first substructure and a top surface of the first substructure adjacent thereto is less than or equal to 2 μm. A one-dimensional size of the top surface of the outermost first substructure is less than or equal to 45 μm, a front surface of the semiconductor substrate 10 has a second texture structure 11, and the second texture structure 11 may include a pyramid-shaped microstructure.

In some embodiments, the doped conductive layer and the semiconductor substrate have doping elements of a same conductivity type. In some embodiments, the doped conductive layer and the semiconductor substrate have doping elements of opposite conductivity type, for example, the semiconductor substrate may be an N-type substrate, but the doped conductive layer may be a P-type doped layer. As another example, the semiconductor substrate may be a P-type substrate, but the doped conductive layer may be an N-type doped layer.

Figure 9:
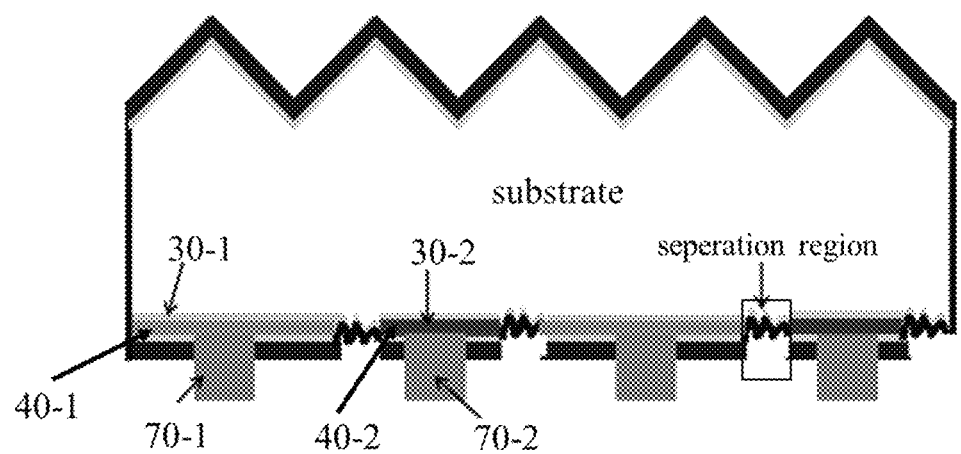
FIG. 9 is a schematic structural diagram of an IBC solar cell according to an embodiment of the present disclosure.

In some embodiments, a first portion of the doped conductive layer and the semiconductor substrate have doping elements of a same conductivity type, but a second portion of the doped conductive layer have doping elements of opposite conductivity type. The first portion of the doped conductive layer and the second portion of doped conductive layer can be separated. For example, the first portion of the doped conductive layer may correspond to the N-type doped layer, the second portion of the doped conductive layer may correspond to the P-type doped layer. Merely for illustration, FIG. 9 shows the IBC solar cell used the TOPCon concept, as show in FIG. 9, the solar cell may include the substrate, the first passivation layer and the second passivation layer which are same as the substrate 10, the first passivation layer 20 and the second passivation layer 50 illustrated in FIG. 1. Different than the structure shown in FIG. 1, the solar cell includes a first tunnel oxide layer 30-1, a second tunnel oxide layer 30-2, a first doped conductive layer 40-1, a second doped conductive layer 40-2. The first tunnel oxide layer 30-1 and the first doped conductive layer 40-1 form a first structure (e.g., N-type TOPCon structure), and the second tunnel oxide layer 30-2 and the second doped conductive layer 40-2 form a second structure (e.g., P-type TOPCon structure). The first structure and the second structure are spaced by a separation region. In some embodiments, the substrate corresponding to the separation region may include a pyramid-shaped microstructure similar to the second texture structure. The pyramid-shaped microstructure in the separation region is formed due to a subsequent etching process for separating the first structure and the second structure.

As shown in FIG. 9, the substrate is the N-type semiconductor substrate, the first doped conductive layer 40-1 is configured as N-type doped layer, such as, N-type doped polysilicon layer, and the second doped conductive layer 40-2 is configured as P-type doped layer, such as, P-type doped polysilicon layer. The first tunnel oxide layer 30-1 and the second tunnel oxide layer may be configured as a thin silicon oxide layer corresponding to the first doped conductive layer 40-1, a second doped conductive layer 40-2, respectively. Further, a first type electrode 70-1 is electrically connected to the first doped conductive layer 40-1 and a second type electrode 70-2 is electrically connected to the second doped conductive layer 40-2.

The front surface of the semiconductor substrate 10 may refer to a light receiving surface, that is, a surface receiving solar rays. The rear surface of the semiconductor substrate 10 refers to a surface opposite the front surface. In some embodiments, the solar cell formed is a single-sided solar cell. The front surface may refer to a light receiving surface, and the rear surface may refer to a backlight surface. In some embodiments, the solar cell formed is a double-sided solar cell. The front surface and the rear surface may both be light receiving surfaces.

As an optional technical solution of the present disclosure, the semiconductor substrate 10 is an N-type crystalline silicon substrate (or silicon wafer). A P-type doped layer may be formed on the front surface of the semiconductor substrate by one or more of the processes of high temperature diffusion, slurry doping, and ion implantation, so as to form a PN junction in the semiconductor substrate 10. In some embodiments, the semiconductor substrate 10 may be one of a monocrystalline silicon substrate, a polycrystalline silicon substrate, a microcrystalline silicon substrate and a silicon carbide substrate.

In some embodiments, the P-type doped layer is a boron-doped diffusion layer. The boron-doped diffusion layer is a P-type doped layer (i.e., P+ layer) formed by using a boron source to diffuse boron atoms to a certain depth on the front surface through a diffusion process. For example, the boron source may be liquid boron tribromide.

Figure 2:
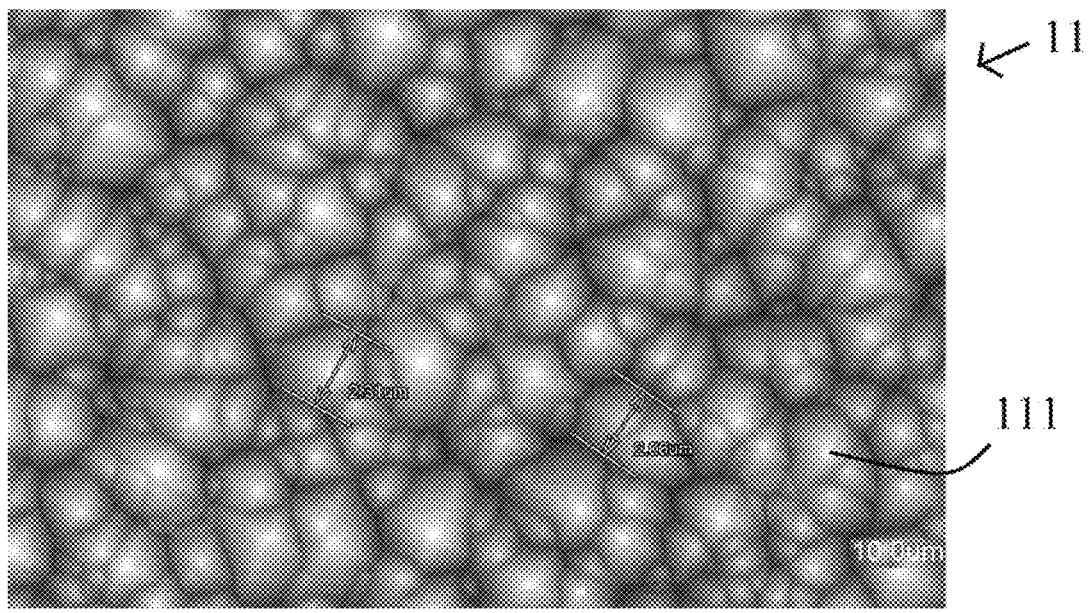
FIG. 2 is an electron microscope picture of a second texture structure on a front surface of a semiconductor substrate of a solar cell according to an embodiment of the present disclosure.

In some embodiments, as shown in FIG. 2, the front surface of the semiconductor substrate 10 has a second texture structure 11, and the second texture structure 11 includes a pyramid-shaped microstructure 111. The pyramid-shaped microstructure 111 may have a structure of a tetrahedron, a substantially tetrahedron, a pentahedron, a substantially pentahedron, or the like. The pyramid-shaped microstructure 111 may be formed by texturing the semiconductor substrate. The texturing process may be chemical etching, laser etching, a mechanical process, plasma etching, or the like. The pyramid-shaped microstructure enables a metal paste to better fill the microstructure when the metal paste forms an electrode by screen printing, which obtains better electrode contact, can effectively reduce series resistance of the solar cell, and improves the fill factor.

In some embodiments, the pyramid-shaped microstructure 111 includes a top away from the front surface of the semiconductor substrate and a bottom close to the front surface of the semiconductor substrate, and in a direction away from the front surface and perpendicular to the front surface, a distance (or height) between the top and the bottom of the pyramid-shaped microstructure is less than or equal to 5 μm. For example, the distance ranges from 2 μm to 5 μm. The distance may be 2 μm, 2.5 μm, 2.8 μm, 3 μm, 3.5 μm, 3.8 μm, 4 μm, 4.2 μm, 4.5 μm, 4.8 μm, 5 μm or the like. When the distance range of the pyramid-shaped microstructure 111 is controlled within 5 μm, for example, 2 μm to 5 μm, the pyramid-shaped microstructure 111 has the characteristics of low reflection, low recombination and easy filling, so that the photoelectric conversion efficiency of the solar cell can be improved.

It may be understood that a number of the pyramid-shaped microstructure formed on the front surface cannot be exhausted due to anisotropy of crystal orientation of silicon crystal on the front surface. The distance of the pyramid-shaped microstructure 111 referred to herein may be a distance between a convex highest point of the top and a concave lowest point of the pyramid-shaped microstructure 111 randomly selected in a specific region. For example, the distance of the pyramid-shaped microstructure 111 may be determined by measuring a surface shape of the semiconductor substrate by using an atomic force microscope (AFM). For example, a scanning range of 40 μm×40 μm is selected from the front surface, the front surface of the semiconductor substrate is scanned within the selected range by using the atomic force microscope, a profile size of the pyramid-shaped microstructure on the front surface is measured, and a height value h is calculated. The convex highest point $h_a$ of the top of the pyramid-shaped microstructure is selected from the measured profile size (an AFM image), the lowest point of the bottom corresponding to the top is $h_b$, and $h=h_a-h_b$ is obtained. In other implementations, heights of a plurality of pyramid-shaped microstructures in the second texture structure are randomly collected, and an average value is calculated. The average value is defined as the height of the pyramid-shaped microstructure. For example, 4 pyramid-shaped microstructures 111 are randomly selected, with heights of h1, h2, h3 and h4 respectively, and then a height value of the pyramid-shaped microstructure 111 is (h1+h2+h3+h4)/4. That is, an average distance of a plurality of pyramid-shaped microstructures 111 can be regarded as a distance of the pyramid-shaped microstructure on the front surface, which is configured to represent a texture feature of the front surface.

As an optional technical solution of the present disclosure, the first passivation layer 20 has a stacking structure of at least one or more of a silicon oxide layer, a silicon nitride layer, an aluminum oxide layer and a silicon oxynitride layer.

In some embodiments, the first passivation layer 20 has a thickness ranging from 10 nm to 120 nm, which may be 10 nm, 20 nm, 30 nm, 40 nm, 50 nm, 60 nm, 70 nm, 80 nm, 90 nm, 100 nm, 120 nm or the like, and may also be other values in the range, which is not limited herein.

In an embodiment, the first passivation layer 20 has a stacked passivation structure of an aluminum oxide layer and a silicon nitride layer. The aluminum oxide layer is arranged on the front surface of the semiconductor substrate 10. The silicon nitride layer is arranged on a surface of the aluminum oxide layer. For example, the aluminum oxide layer has a thickness ranging from 2 nm to 10 nm, and the aluminum oxide layer has a refractive index ranging from 1.5 to 1.8. The silicon nitride layer has a thickness ranging from 50 nm to 110 nm, and the silicon nitride layer has a refractive index ranging from 1.65 to 2.25. The first passivation layer 20 has an overall refractive index ranging from 1.9 to 2.0. The aluminum oxide layer or silicon nitride layer may include a plurality of sublayers. For example, the silicon nitride layer is composed of 2 to 5 silicon nitride sublayers.

In an embodiment, the first passivation layer has a stacked passivation structure of an aluminum oxide layer, a silicon nitride layer and a silicon oxynitride layer sequentially stacked. The aluminum oxide layer has a thickness ranging from 2 nm to 10 nm, the aluminum oxide layer has a refractive index ranging from 1.5 to 1.8, the silicon nitride layer has a thickness ranging from 40 nm to 80 nm, the silicon nitride layer has a refractive index ranging from 1.9 to 2.3, the silicon oxynitride layer has a thickness ranging from 10 nm to 60 nm, and the silicon oxynitride layer has a refractive index ranging from 1.5 to 1.75.

Further, the rear surface of the semiconductor substrate 10 has a first texture structure 12. The first texture structure 12 may be formed by alkali polishing.

Figure 3:
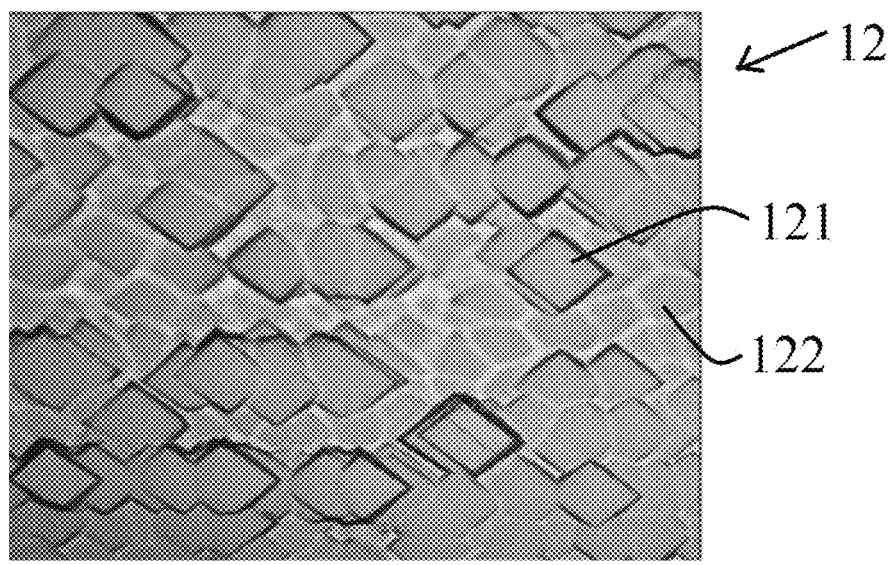
FIG. 3 is an electron microscope picture of a first texture structure on a rear surface of the semiconductor substrate of the solar cell according to an embodiment of the present disclosure.

As an optional technical solution of the present disclosure, FIG. 3 is an electron microscope picture of the first texture structure 12 on the rear surface of the semiconductor substrate of the solar cell according to an embodiment of the present disclosure. As shown in FIG. 3, the first texture structure 12 includes two or more first substructures 121 at least partially stacked on one another. The first texture structure 12 presents a non-pyramid-shaped microstructure profile. For example, the first texture structure may present a substantially "step" profile, and the first substructure 121 may be regarded as a stair of the "step".

Figure 4A:
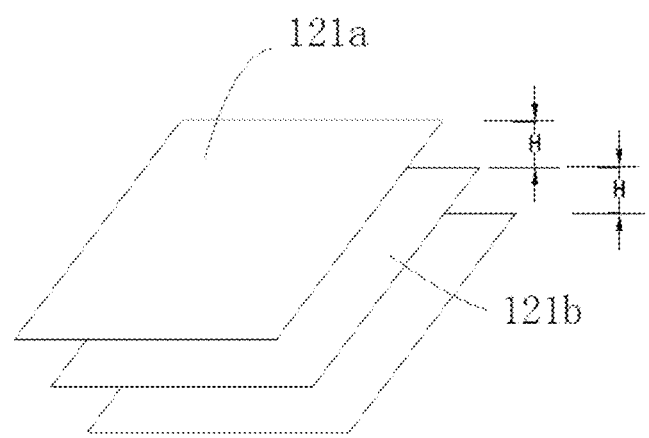
FIG. 4a is a schematic structural diagram of a first substructure in the first texture structure of the rear surface of the semiconductor substrate of the solar cell according to an embodiment of the present disclosure.
Figure 4B:
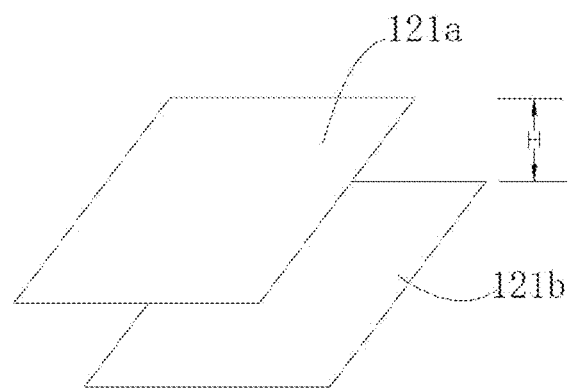
FIG. 4b is a schematic structural diagram of another first substructure in the first texture structure of the rear surface of the semiconductor substrate of the solar cell according to an embodiment of the present disclosure.
Figure 5:
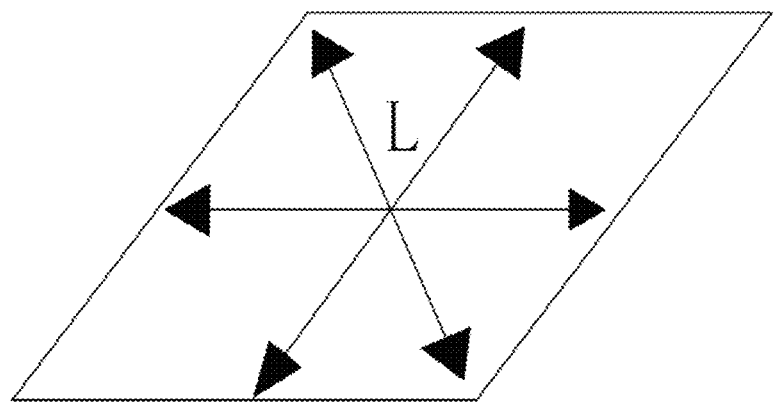
FIG. 5 is a schematic structural diagram of a substructure in the first texture structure of the rear surface of the semiconductor substrate of the solar cell according to an embodiment of the present disclosure.

FIG. 4a is a schematic diagram of three layers of first substructures partially stacked, and FIG. 4b is a schematic diagram of two layers of first substructures partially stacked. Reference sign 121a denotes the outermost first substructure in the first texture structure away from the rear surface, and 121b denotes an adjacent first substructure.

For the two or more first substructures 121 at least partially stacked on one another, in a direction away from the rear surface and perpendicular to the rear surface (which may also be understood as "in a stacking direction"), a distance H between a top surface of the outermost first substructure 121a and a top surface of the first substructure 121b adjacent thereto is less than or equal to 2 μm, which may be 2 μm, 1.8 μm, 1.5 μm, 1.2 μm, 1.1 μm, 1.0 μm, 0.8 μm, 0.5 μm, 0.3 μm, 0.2 μm, 0.1 μm or the like. When the distance H is more than 2 μm, the roughness of the first texture structure is excessively large, and the thickness of the tunnel oxide layer 30 formed on the first texture structure is larger, which bring adverse effects to the formation of the tunnel oxide layer with high density and high uniformity, thereby affecting tunneling and passivation effects of the tunnel oxide layer 30. If the roughness of the first texture structure is excessively small, the thickness of the tunnel oxide layer formed on the first texture structure is smaller, which brings adverse effects to the contact with an electrode paste. In an embodiment, in the direction away from the rear surface and perpendicular to the rear surface, the distance between the top surface of the outermost first substructure 121a and the top surface of the first substructure 121b adjacent thereto ranges from 0.3 μm to 1.2 km.

It should be noted that, when the three layers of first substructures are stacked, a distance H between a top surface of the first substructure 121a in any layer and a top surface of the first substructure 121b in an adjacent layer is less than or equal to 2 km.

It is appreciated that, the distance between the top surface of the outermost first substructure 121a and the top surface of the first substructure 121b adjacent thereto is controlled to be less than or equal to 2 μm, so that the roughness of the first texture structure is controlled within a desired range, which helps to improve the uniformity of the tunnel oxide layer formed on the first texture structure, ensure better performance of the tunnel oxide layer formed, further inhibit a high local phosphorus concentration caused by phosphorous diffusion, reduce contact resistivity, improve the open-circuit voltage of the solar cell, and improve the fill factor and photoelectric conversion efficiency.

A one-dimensional size L of the top surface of the outermost first substructure 121a is less than or equal to 45 μm, that is, 0<L≤45 μm. In an embodiment, the one-dimensional size L is within a range of 2 μm to 45 μm. Here, the one-dimensional size L of the top surface may be a length, width, diagonal length or circular diameter of the surface, which is not limited herein. In some embodiments, the one-dimensional size may be an average value of one-dimensional sizes of top surfaces of a plurality of outermost first substructures within a preset range region of the rear surface of the substrate. An average one-dimensional size of the top surface of the outermost first substructure may be 2

μm, 5 μm, 8 μm, 12 μm, 15 μm, 18 μm, 20 μm, 25 μm, 28 μm, 30 μm, 35 μm, 40 μm, 42 μm, 40 μm, 45 μm or the like. For example, an average one-dimensional size of the top surface of the outermost first substructure ranges from m to 15 μm.

In an embodiment, as shown in FIG. 3, the first texture structure further includes two or more adjacent second substructures 122 that are not stacked, and a one-dimensional size L of a top surface of the second substructure 122 away from the rear surface is less than or equal to 45 μm, that is, 0<L≤45 μm. In an embodiment, the one-dimensional size L of the second substructure 122 is within a range of 2 μm to 45 μm, which may be 2 μm, 5 μm, 8 μm, 12 μm, 15 μm, 18 μm, 20 μm, 25 μm, 28 μm, 30 μm, 32 μm, 35 μm, 45 μm or the like.

Different from the pyramid-shaped microstructure of the front surface, the top surface of the first substructure and/or the top surface of the second substructure of the rear surface is a polygonal plane. The polygonal plane is in a shape of at least one of a diamond, a square, a trapezoid, a substantially diamond, a substantially square and a substantially trapezoid. It shall be understood that, during actual manufacturing process, the top surface of the first substructure or second substructure presents a profile of an irregular polygon plane, and wholly presents a profile of a substantially diamond, a square and a trapezoid.

In some examples, the manufacturing of subsequent passivation film layers, such as the first passivation layer 20, the tunnel oxide layer 30 and the doped conductive layer 40, may damage original structures of the second texture structure and the first texture structure to some extent. For example, in a mass-produced solar cell, the second texture structure may also include a small number of non-pyramid-shaped microstructures formed due to the damages to the spires of the pyramid-shaped microstructures.

In some examples, when a texture size representing the second texture structure or the first texture structure of the solar cell is measured, such as the one-dimensional size of the top surface of the first substructure and the distance between the surfaces of adjacent first substructures, surfaces of the film layers are directly measured for calibration through a test instrument (an optical microscope, an atomic force microscope, a scanning electron microscope, a transmission electron microscope, or the like). In one case, since the thickness of the film layer is in nanoscale, it can be obtained directly using film layer measurement data corresponding to the second texture structure or the first texture structure, and the film layer measurement data is a sum of the thickness of the film layer and a texture size. In another case, it can also be obtained by subtracting film layer thickness data from the film layer measurement data. The above measurement means are only examples and are not limited in the present disclosure.

Figure 6:
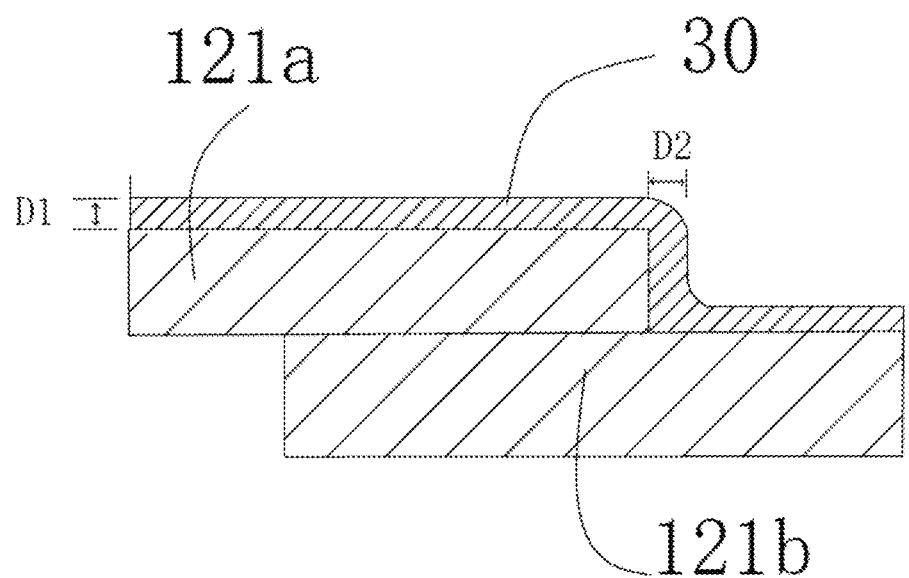
FIG. 6 is a schematic structural diagram of a tunnel oxide layer on the first texture structure of the rear surface of the semiconductor substrate of the solar cell according to an embodiment of the present disclosure.

As shown in FIG. 1 and FIG. 6, the tunnel oxide layer 30 located on the first texture structure 12 of the rear surface of the semiconductor substrate 10 may have a stacking structure of one or more of a silicon oxide layer, an aluminum oxide layer, a silicon oxynitride layer, a molybdenum oxide layer and a hafnium oxide layer. In other embodiments, the tunnel oxide layer 30 may also be an oxygen-containing silicon nitride layer, an oxygen-containing silicon carbide layer or the like. The tunnel oxide layer 30 has a thickness ranging from 0.8 nm to 2 nm. For example, the thickness of the tunnel oxide layer 30 is 0.8 nm, 0.9 nm, 1.0 nm, 1.2 nm, 1.4 nm, 1.6 nm, 1.8 nm, 2 nm or the like. The thickness of the tunnel oxide layer 30 refers to a thickness of the tunnel oxide layer relative to a formation surface. The thickness of the tunnel oxide layer 30 formed on the first texture structure can be calculated by taking a normal direction of an inclined surface of the substructure as a thickness direction and observing a cross section thereof. When the thickness of the tunnel oxide layer 30 is excessively large, it may bring adverse effects to reducing the contact resistance of the tunnel oxide layer. A decrease in the fill factor caused by the contact resistance can be inhibited by controlling the thickness of the tunnel oxide layer.

In an embodiment, a band gap width of the tunnel oxide layer 30 is greater than 3.0 eV, and it is generally difficult to transport carriers through the tunnel oxide layer 30 by thermal emission. However, the tunnel oxide layer 30 is very thin and carriers can pass through the tunnel oxide layer 30 through a tunnel effect, so the tunnel oxide layer having a thickness within a range of 0.8 nm to 2 nm does not block the transport of most carriers. As the thickness of the tunnel oxide layer gradually increases, the tunnel effect of most carriers is affected, and it is difficult to transport the carriers through the tunnel oxide layer 30, and the photoelectric conversion efficiency of the solar cell may gradually decrease. When the thickness of the tunnel oxide layer is excessively small, the tunnel oxide layer cannot perform the passivation effect. As a result, in an embodiment, the tunnel oxide layer 30 is a silicon oxide layer, and the tunnel oxide layer 30 has a thickness ranging from 0.8 nm to 1.5 nm.

As an optional technical solution of the present disclosure, as shown in FIG. 6, a thickness D1 of the tunnel oxide layer on the top surface of the outermost first substructure is less than a thickness D2 of the tunnel oxide layer on a side surface of the outermost first substructure. For example, a thickness difference (D2-D1) between the tunnel oxide layer on the top surface of the outermost first substructure and the tunnel oxide layer on a side surface of the outermost substructure is less than or equal to 0.15 nm. The thickness difference may be 0.14 nm, 0.13 nm, 0.12 nm, 0.11 nm, 0.10 nm, 0.09 nm, 0.08 nm, 0.07 nm, 0.06 nm, 0.05 nm, 0.04 nm or the like. When the tunnel oxide layer on the top surface of the outermost first substructure and the tunnel oxide layer on the side surface of the outermost substructure are excessively large, the thickness of the tunnel oxide layer has poor uniformity, a current density of the solar cell is easily affected, and the open-circuit voltage of the solar cell decreases.

In some embodiments, texture structures with different profiles are arranged on the front and rear surfaces of the semiconductor substrate, a pyramidal texture structure is formed on the front surface, and a non-pyramidal texture structure is formed on the rear surface, so that the solar cell formed has a light trap structure at different levels, which increases an effective contact area of light. Moreover, for the first texture structure formed on the rear surface, the distance between the top surface of the outermost first substructure and the top surface of the first substructure adjacent thereto is controlled within 2 μm, which helps to reduce a pinhole in the tunnel oxide layer and then improves the density and uniformity of the tunnel oxide layer, further inhibit a high local doping concentration of the doped conductive layer on the surface of the tunnel oxide layer, reduce contact resistivity, improve the open-circuit voltage of the solar cell, and improve the fill factor and photoelectric conversion efficiency.

In some embodiments, the doped conductive layer 40 may be a doped polycrystalline silicon layer, a doped microcrystalline silicon layer or a doped amorphous silicon layer. The doped conductive layer 40 and the semiconductor substrate have doping elements of a same conductivity type.

When the semiconductor substrate 10 is an N-type monocrystalline silicon, the doped conductive layer 40 is an N-type doped polycrystalline silicon layer, an N-type doped microcrystalline silicon layer or an N-type doped amorphous silicon layer, and the doping element may be an N-type doping element such as phosphorus.

In some embodiments, the doped conductive layer 40 has a thickness ranging from 60 nm to 200 nm. For example, as an N-type doped polycrystalline silicon layer, the doped conductive layer 40 may have a refractive index ranging from 3.5 to 4.5.

As an optional technical solution of the present disclosure, the second passivation layer 50 includes at least one of a silicon nitride layer, a silicon oxide layer and a silicon oxynitride layer. The second passivation layer 50 has a thickness ranging from 70 nm to 120 nm. For example, the second passivation layer 50 is a silicon nitride layer. The silicon nitride layer has a low silicon to nitrogen ratio, and the silicon nitride layer has a refractive index ranging from 1.7 to 2.1, which may be 1.7, 1.8, 1.9, 2.0, 2.1 or the like, and may also be other values in the above range, and is not limited herein. The refractive index of the silicon nitride layer is controlled to enable the silicon nitride layer to have low silicon to nitrogen ratio, so that contact resistivity can be reduced during metallization of the second passivation layer 50 formed, so as to further reduce the contact resistivity of the solar cell.

In some embodiments, when the second passivation layer 50 has a stacking structure of a silicon nitride layer and a silicon oxide layer or a stacking structure of a silicon nitride layer and a silicon oxynitride layer, the silicon nitride layer is located on a surface of the doped conductive layer, and the silicon oxide layer or the silicon oxynitride layer is located on a surface of the silicon nitride layer.

Further, the solar cell further includes a first electrode 60 and a second electrode 70. The first electrode 60 passes through the first passivation layer 20 to form ohmic contact with the P-type doped layer (for example, the boron-doped diffusion layer) on the front surface of the semiconductor substrate 10. The second electrode 70 passes through the second passivation layer 50 to form ohmic contact with the doped conductive layer 40. The doped conductive layer 40 and the tunnel oxide layer 30 form a passivated contact structure. The first electrode 60 and the second electrode 70 may be formed by sintering a metal conductive paste coated on surfaces of the first passivation layer and the second passivation layer. In some embodiments, the first electrode 60 or the second electrode 70 is made of a metal material such as silver, aluminum, copper or nickel.

For the solar cell formed as shown in FIG. 1, that is, the second texture structure of the pyramid-shaped microstructure formed on the front surface of the semiconductor substrate 10, the first texture structure of the non-pyramid-shaped microstructure formed on the rear surface of the semiconductor substrate, the first passivation layer 20 (for example, a stacked passivation structure of an aluminum oxide layer and a silicon nitride layer) formed on the second texture structure, and the tunnel oxide layer 30, the doped conductive layer 40 and the second passivation layer 50 (for example, a silicon nitride layer) matching one another formed on the first texture structure. The solar cell structure formed as above has higher photoelectric conversion efficiency.

For the solar cell formed as shown in FIG. 9, the first structure is formed by the first tunnel oxide layer 30-1 and the first doped conductive layer 40-1, the second structure is formed by the second tunnel oxide layer 30-2 and the second doped conductive layer 40-2, the first structure and the second structure are spaced from each other by a separation region. In this way, the TOPCon concept is also applicable to the IBC solar cell with high efficiency.

In a second aspect, an embodiment of the present disclosure provides a photovoltaic module including a plurality of solar cell strings.

Figure 7A:
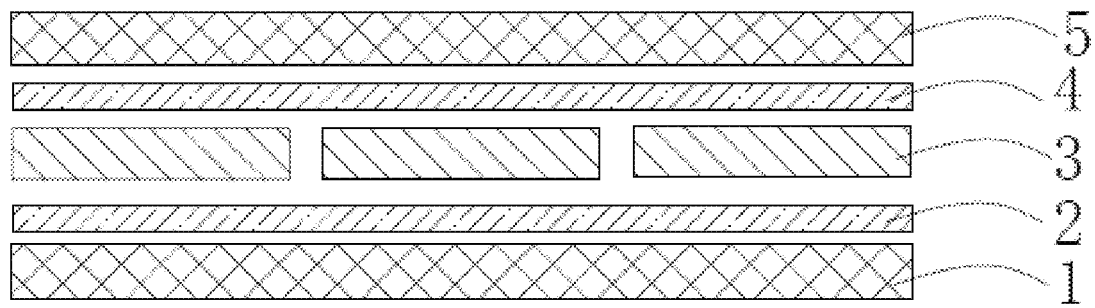
FIG. 7a is a schematic structural diagram of a photovoltaic module according to an embodiment of the present disclosure.
Figure 7B:
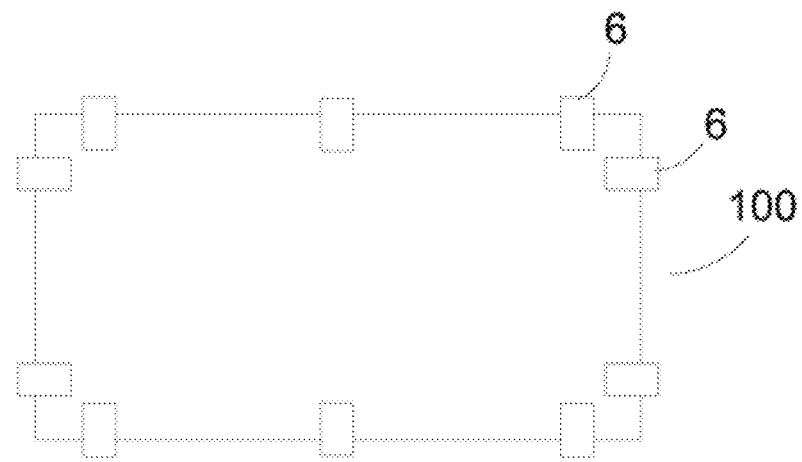
FIG. 7b is a top view of the photovoltaic module according to an embodiment of the present disclosure.

As shown in FIG. 7a and FIG. 7b, the photovoltaic module includes a first cover plate 1, a first packaging adhesive layer 2, a solar cell string 3, a second packaging layer 4 and a second cover plate 5.

The solar cell string 3 includes a plurality of solar cells (the solar cell as shown in FIG. 1) that are connected through a conductive band (not shown). The solar cells may be connected by partial stacking or by splicing.

The first cover plate 1 and the second cover plate 5 are transparent or opaque cover plates, such as glass cover plates or plastic cover plates.

Two sides of the first packaging adhesive layer 2 contact and are bonded to the first cover plate 1 and the solar cells 3, respectively, and two sides of the second packaging layer 2 are contact and are bonded to the second cover plate 1 and the solar cells 3, respectively. The first packaging adhesive layer 2 and the second packaging layer 4 may be ethylene-vinyl acetate copolymer (EVA) film, a polyolefin elastomer (POE) film or a polyethylene terephthalate (PET) film, respectively.

Side edges of the photovoltaic module may also be completely packaged, that is, the side edges of the photovoltaic module are fully packaged with a packaging adhesive tape to prevent a stacking deviation during the stacking of the photovoltaic module.

Further, the photovoltaic module (the photovoltaic module 100 shown in FIG. 7b) further includes an edge sealing member 6 fixedly packaged to a partial edge of the photovoltaic module. As shown in FIG. 7b, the edge sealing member 6 is fixedly packaged to an edge of the photovoltaic module near a corner. The edge sealing member 6 may be a high-temperature resistant tape. The high-temperature resistant tape has excellent high-temperature resistance and may not decompose or fall off during the stacking, which can ensure the reliable packaging of the photovoltaic module. Two ends of the high-temperature resistant tape are fixed to the second cover plate 5 and the first cover plate 1, respectively. The two ends of the high-temperature resistant tape may be bonded to the second cover 5 and the first cover 1, respectively, and the middle thereof can limit a side edge of the photovoltaic module to prevent a stacking deviation of the photovoltaic module during the stacking.

Figure 8:
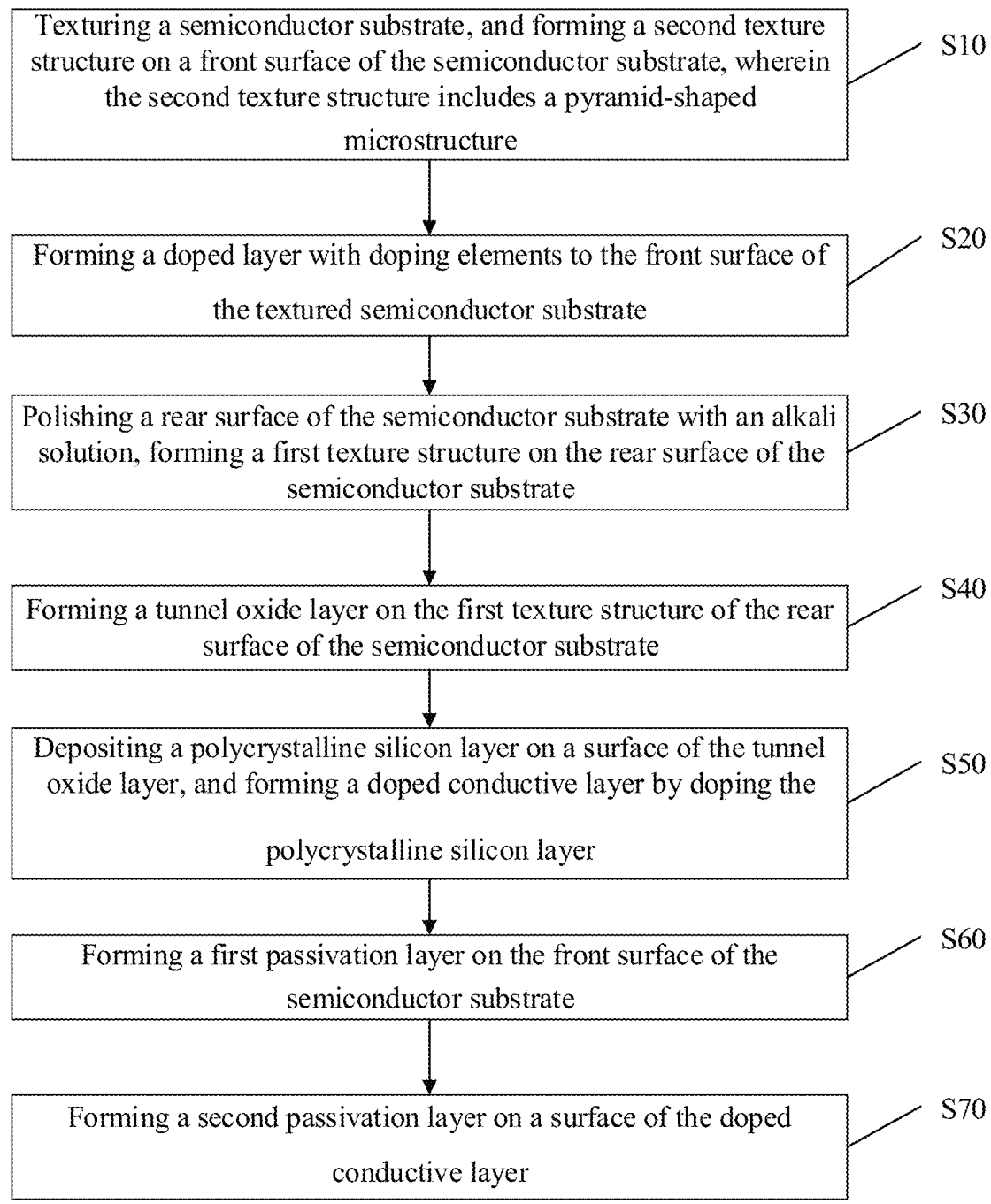
FIG. 8 is a schematic flowchart of a method for manufacturing a solar cell according to an embodiment of the present disclosure.

In a third aspect, the present disclosure further provides a method for manufacturing a solar cell for manufacturing the solar cell described above. As shown in FIG. 8, the method includes the following steps.

In S10, a semiconductor substrate is textured, and a second texture structure is formed on a front surface of the semiconductor substrate, the second texture structure includes a pyramid-shaped microstructure.

In S20, the front surface of the textured semiconductor substrate is doped to form a doped layer.

In S30, a rear surface of the semiconductor substrate is polished with an alkali solution, so that a first texture structure is formed on the rear surface of the semiconductor substrate, the first texture structure includes two or more first substructures at least partially stacked, for the two or more first substructures at least partially stacked, in a direction away from the rear surface and perpendicular to the rear surface, a distance between a top surface of the outermost first substructure and a top surface of the first substructure adjacent thereto is less than or equal to 2 μm, and a one-dimensional size of the top surface of the outermost first substructure is less than or equal to 45 μm.

In S40, a tunnel oxide layer is formed on the first texture structure of the rear surface of the semiconductor substrate.

In S50, a polycrystalline silicon layer is formed on a surface of the tunnel oxide layer, and the polycrystalline silicon layer is doped to form a doped conductive layer, the doped conductive layer and the semiconductor substrate having doping elements of a same conductivity type.

In S60, a first passivation layer is formed on the front surface of the semiconductor substrate.

In S70, a second passivation layer is formed on a surface of the doped conductive layer.

In the above solution, the rear surface of the semiconductor substrate is polished with an alkali solution, so that texture structures with different profiles are formed on the front and rear surfaces of the semiconductor substrate. A pyramidal texture structure is formed on the front surface, and a non-pyramidal texture structure is formed on the rear surface, so that the solar cell formed has a light trap structure at different levels, which increases an effective contact area of light. Moreover, for the first texture structure formed on the rear surface, the distance between the top surface of the outermost first substructure and the top surface of the first substructure adjacent thereto is controlled within 2 μm, which helps to reduce a pinhole in the tunnel oxide layer and then improve the density and uniformity of the tunnel oxide layer, further inhibit a high local doping concentration of the doped conductive layer on the surface of the tunnel oxide layer, reduce contact resistivity, improve the open-circuit voltage of the solar cell, and improve the fill factor and photoelectric conversion efficiency.

The solution is described in detail as follows.

In S10, a semiconductor substrate is textured, and a second texture structure is formed on a front surface of the semiconductor substrate, the second texture structure includes a pyramid-shaped microstructure.

The semiconductor substrate may be a crystalline silicon substrate, which is, for example, one of a polycrystalline silicon substrate, a monocrystalline silicon substrate, a microcrystalline silicon substrate and a silicon carbide substrate. A specific type of the semiconductor substrate is not limited in the embodiments of the present disclosure. In some embodiments, the semiconductor substrate is an N-type crystalline silicon substrate (or silicon wafer). The semiconductor substrate has a thickness ranging from 60 μm to 240 μm, which may be 60 μm, 80 μm, 90 μm, 100 μm, 120 μm, 150 μm, 200 μm, 240 μm or the like. The doping elements of the semiconductor substrate may be phosphorus, nitrogen and the like.

It shall be noted that the present disclosure does not limit how the texturing is performed. For example, an N-type substrate may be textured using, but not limited to, a wet texturing process. When the N-type semiconductor substrate is an N-type crystalline silicon substrate, the texturing may be performed using an alkaline solution such as a potassium hydroxide solution. Since the corrosion of the NaOH solution is anisotropic, a pyramid-shaped microstructure can be manufactured.

As shown in FIG. 2, the front surface of the semiconductor substrate 10 has a second texture structure 11, and the second texture structure 11 includes a pyramid-shaped microstructure 111. The pyramid-shaped microstructure 111 may have a structure of a tetrahedron, a substantially tetrahedron, a pentahedron, a substantially pentahedron, or the like. The pyramid-shaped microstructure 111 may be formed by texturing the semiconductor substrate. The texturing may be chemical etching, laser etching, a mechanical process, plasma etching, or the like. The pyramid-shaped microstructure enables a metal paste to better fill the microstructure when the metal paste forms an electrode by screen printing, to obtain better electrode contact, which can effectively reduce series resistance of the solar cell, and improve the fill factor.

In S20, the front surface of the textured semiconductor substrate is doped to form a doped layer.

In an embodiment, when the semiconductor substrate 10 is an N-type substrate, a P-type doped layer may be formed on the front surface of the semiconductor substrate by one or more of the processes of high temperature diffusion, slurry doping, and ion implantation, so as to form a PN junction in the semiconductor substrate 10.

In some embodiments, the P-type doped layer is a boron-doped diffusion layer. The boron-doped diffusion layer is a P-type doped layer (i.e., P+ layer) formed by using a boron source to diffuse boron atoms to a certain depth on the front surface through a diffusion process. For example, the boron source may be liquid boron tribromide. A microcrystalline silicon phase of the substrate after boron diffusion treatment is transformed into a polycrystalline silicon phase. Since the surface of the semiconductor substrate has a high concentration of boron, a borosilicate glass (BSG) layer is generally formed.

Further, in S30, prior to the step of polishing a rear surface of the semiconductor substrate with an alkali solution, the method further includes: removing the borosilicate glass layer from the rear surface of the semiconductor substrate with a prepared mixed acid, the mixed acid includes hydrogen fluoride having a mass fraction of 0.1% to 10%, sulfuric acid having a mass fraction of 10% to 20% and nitric acid having a mass fraction of 25% to 50%; and washing and drying the rear surface of the semiconductor substrate after pickling.

During the boron diffusion treatment, the rear surface of the semiconductor substrate is coated to form part of the borosilicate glass, which shall be removed. It shall be noted that a porous structure may appear on the rear surface of the semiconductor substrate after pickling.

In an embodiment, a pickling time ranges from 10 seconds to 180 seconds, and a pickling temperature ranges from 7° C. to 20° C., that is, the borosilicate glass on the rear surface of the semiconductor substrate is removed by pickling at room temperature to expose a body of the semiconductor substrate.

In S30, the rear surface of the semiconductor substrate is polished with the alkali solution, so that a first texture structure is formed on the rear surface of the semiconductor substrate.

In an embodiment, the rear surface of the semiconductor substrate is cleaned with the alkali solution having a mass fraction of 5% to 15% to remove porous silicon.

Micro-liquid droplets of the alkali solution are dropped by spraying to the rear surface of the semiconductor substrate for roughening treatment, and then pre-cleaning is performed with a hydrofluoric acid having a mass fraction of 5% to 10%.

The rear surface of the semiconductor substrate is polished with a polishing liquid at a polishing temperature ranging from 70° C. to 80° C. for a polishing time less than 260 seconds. The polishing liquid includes NaOH having a mass fraction of 1% to 15%, KOH having a mass fraction of 1% to 15% and an additive having a mass fraction of 0.5% to 2.5%. Here, the polishing liquid may be designated as the etching solution.

Organic components in the etching solution are removed by a mixture of potassium hydroxide having a mass fraction of 5% to 15% and hydrogen peroxide having a mass fraction of 15% to 40%.

The polished semiconductor substrate is washed and dried.

In some embodiments, when the rear surface is polished, the borosilicate glass layer on the front surface of the semiconductor substrate shall be protected, for example, by a mask.

In an embodiment, due to the low boron concentration on the rear surface of the semiconductor substrate, the etching efficiency can be improved effectively by using the alkali solution. The alkali solutions contain organic bases and/or inorganic bases. The inorganic bases may be NaOH, KOH, $Ga(OH)_2$, $NH_3 \cdot H_2O$, and the organic bases may be triethylamine, nitrophenol, pyridine, quinine, colchicine, and the like. The additive in the polishing liquid may be a buffer solution composed of sodium sulfonate, maleic anhydride, alkyl glycoside, and the like.

The polishing temperature may be 70° C., 72° C., 74° C., 75° C., 78° C., 79° C., 80° C. or the like, and the polishing time may be 250 seconds, 240 seconds, 230 seconds, 220 seconds, 200 seconds, 180 seconds, 160 seconds, 140 seconds, 120 seconds, 100 seconds, 80 seconds or the like, which may also be other values in the above ranges.

In some embodiments, a polishing weight loss of the semiconductor substrate is less than 0.3 g.

A shape of the substructure in the first texture structure after polishing may be adjusted by controlling the polishing time and the polishing temperature, so that in the two or more first substructures at least partially stacked a distance between a top surface of the outermost first substructure and a top surface of the first substructure adjacent thereto is less than or equal to 2 µm in a direction away from the rear surface and perpendicular to the rear surface, so as to increase the roughness of the rear surface of the semiconductor substrate.

In some embodiments, the first texture structure including a non-pyramid-shaped microstructure may be formed by hot-air drying the surface of the semiconductor substrate.

As an optional technical solution of the present disclosure, FIG. 3 is an electron microscope picture of the first texture structure 12 on the rear surface of the semiconductor substrate of the solar cell according to an embodiment of the present disclosure. As shown in FIG. 3, the first texture structure 12 includes two or more first substructures 121 at least partially stacked.

FIG. 4a is a schematic diagram of three layers of first substructures partially stacked, and FIG. 4b is a schematic diagram of two layers of first substructures partially stacked. Reference sign 121a denotes the outermost first substructure in the first texture structure away from the rear surface, and 121b denotes the innermost first substructure in the first texture structure close to the rear surface.

For the two or more first substructures 121 at least partially stacked, in the direction away from the rear surface and perpendicular to the rear surface, a distance H between a top surface of the outermost first substructure 121a and a top surface of the first substructure 121b adjacent thereto is less than or equal to 2 µm, which may be 2 µm, 1.8 µm, 1.5 µm, 1.2 µm, 1.1 µm, 1.0 µm, 0.8 µm, 0.5 µm, 0.3 µm, 0.2 µm, 0.1 µm or the like. When the distance H is more than 2 µm, the roughness of the first texture structure is excessively large, and the thickness of the tunnel oxide layer 30 formed on the first texture structure is larger, which brings adverse effects to the formation of the tunnel oxide layer with high density and high uniformity, thereby affecting tunneling and passivation effects of the tunnel oxide layer 30. If the roughness of the first texture structure is excessively small, the thickness of the tunnel oxide layer formed on the first texture structure is smaller, which brings adverse effects to the contact with an electrode paste. As a result, in an embodiment, in the direction away from the rear surface and perpendicular to the rear surface, the distance between the top surface of the outermost first substructure 121a and the top surface of the first substructure 121b adjacent thereto ranges from 0.3 µm to 1.2 µm.

It shall be noted that, when the three layers of first substructures are stacked, a distance H between a top surface of the first substructure 121a in any layer and a top surface of the first substructure 121b in an adjacent layer is less than or equal to 2 µm.

The distance between the top surface of the outermost first substructure 121a and the top surface of the first substructure 121b adjacent thereto is controlled to be less than or equal to 2 µm, so that the roughness of the first texture structure is controlled within a desired range, which helps to improve the uniformity of the tunnel oxide layer formed on the first texture structure, ensure better performance of the tunnel oxide layer formed, further inhibit a high local phosphorus concentration caused by phosphorous diffusion, reduce contact resistivity, improve the open-circuit voltage of the solar cell, and improve the fill factor and photoelectric conversion efficiency.

A one-dimensional size L of the top surface of the outermost first substructure 121a is less than or equal to 45 µm. In an embodiment, the one-dimensional size L is within a range of 2 µm to 45 µm. Here, the one-dimensional size L of the top surface may be a length, width, diagonal length or circular diameter of the surface, which is not limited herein. In some embodiments, the one-dimensional size may be an average value of one-dimensional sizes of top surfaces of a plurality of outermost first substructures within a preset range region of the rear surface of the substrate. An average one-dimensional size of the top surface of the outermost first substructure may be 2 µm, 5 µm, 8 µm, 12 µm, 15 µm, 18 µm, 20 µm, 25 µm, 28 µm, 30 µm, 35 µm, 40 µm, 42 µm, 40 µm, 45 µm or the like. For example, an average one-dimensional size of the top surface of the outermost first substructure ranges from 10 µm to 15 µm.

In an embodiment, as shown in FIG. 3, the first texture structure further includes two or more adjacent second substructures 122 not stacked, and a one-dimensional size L of a top surface of the second substructure 122 away from the rear surface is less than or equal to 45 µm. In an embodiment, the one-dimensional size L of the first substructure 122 is within a range of 2 µm to 45 µm, which may be 2 µm, 5 µm, 8 µm, 12 µm, 15 µm, 18 µm, 20 µm, 25 µm, 28 µm, 30 µm, 32 µm, 35 µm, 45 µm or the like.

Different from the typical pyramid-shaped microstructure of the front surface, the top surface of the first substructure and/or the top surface of the second substructure of the rear surface is a polygonal plane. The polygonal plane is in a shape of at least one of a diamond, a square, a trapezoid, a substantially diamond, a substantially square and a substantially trapezoid. It shall be understood that, during actual manufacturing, the top surface of the first substructure or second substructure presents a profile of an irregular polygon plane, and presents in entirety a profile of a substantially diamond, a square and a trapezoid.

In S40, a tunnel oxide layer is formed on the first texture structure of the rear surface of the semiconductor substrate.

In some embodiments, the rear surface of the semiconductor substrate may be etched and then treated by ozone oxidation, high temperature thermal oxidation, nitric acid oxidation, chemical vapor deposition and low-pressure chemical vapor deposition to form the tunnel oxide layer 30.

In some embodiments, the tunnel oxide layer 30 is deposited on the rear surface of the semiconductor substrate by a temperature change process and chemical vapor deposition. During the deposition, a heating rate is controlled to range from 0.5° C./min to 3° C./min, a deposition temperature is controlled to range from 560° C. to 620° C. and a deposition time is controlled to range from 3 min to 10 min.

For example, during the deposition, the deposition temperature may be 560° C., 570° C., 580° C., 590° C., 600° C., 610° C., 615° C., 620° C. or the like, the deposition time may be 3 min, 4 min, 5 min, 6 min, 7 min, 8 min, 9 min, 10 min or the like, and the heating rate may be 0.5° C./min, 0.8° C./min, 1.0° C./min, 1.2° C./min, 1.5° C./min, 2.0° C./min, 2.5° C./min, 3° C./min or the like, which may also be other values in the above ranges and are not limited herein.

The tunnel oxide layer 30 is deposited on the rear surface of the semiconductor substrate by low-pressure chemical vapor deposition, which can reduce the influence of a high local doping concentration of the thinner tunnel oxide layer 30 in subsequent high temperature doping treatment and reduce the fluctuation of the open-circuit voltage. The tunnel oxide layer 30 formed by the temperature change process and low-pressure chemical vapor deposition can increase the open-circuit voltage of the solar cell by 4 mV to 6 mV.

The tunnel oxide layer 30 may have a stacking structure of one or more of a silicon oxide layer, an aluminum oxide layer, a silicon oxynitride layer, a molybdenum oxide layer and a hafnium oxide layer. In other embodiments, the tunnel oxide layer 30 may also be an oxygen-containing silicon nitride layer, an oxygen-containing silicon carbide layer or the like. The tunnel oxide layer 30 has a thickness ranging from 0.8 nm to 2 nm. For example, the thickness of the tunnel oxide layer 30 is 0.8 nm, 0.9 nm, 1.0 nm, 1.2 nm, 1.4 nm, 1.6 nm, 1.8 nm, 2 nm or the like. The thickness of the tunnel oxide layer 30 refers to a thickness of the tunnel oxide layer relative to a formation surface. The thickness of the tunnel oxide layer 30 formed on the first texture structure can be calculated by taking a normal direction of an inclined surface of the substructure as a thickness direction and observing a cross section thereof. When the thickness of the tunnel oxide layer 30 is excessively large, it brings adverse effects to reducing the contact resistance of the tunnel oxide layer. A decrease in the fill factor caused by the contact resistance can be inhibited by controlling the thickness of the tunnel oxide layer.

A band gap width of the tunnel oxide layer 30 is greater than 3.0 eV, and it is generally difficult to transport carriers through the tunnel oxide layer 30 by thermal emission. However, the tunnel oxide layer 30 is very thin and carriers can pass through the tunnel oxide layer 30 through a tunnel effect, so the tunnel oxide layer having a thickness within a range of 0.8 nm to 2 nm does not block the transport of most carriers. As the thickness of the tunnel oxide layer gradually increases, the tunnel effect of most carriers is affected, and it is difficult to transport the carriers through the tunnel oxide layer 30, and the photoelectric conversion efficiency of the solar cell may gradually decrease. When the thickness of the tunnel oxide layer is excessively small, the tunnel oxide layer cannot have a passivation effect. As a result, in an embodiment, the tunnel oxide layer 30 is a silicon oxide layer, and the tunnel oxide layer 30 has a thickness ranging from 0.8 nm to 1.5 nm.

As an optional technical solution of the present disclosure, as shown in FIG. 6, a thickness D1 of the tunnel oxide layer on the top surface of the outermost first substructure is less than a thickness D2 of the tunnel oxide layer on a side surface of the outermost first substructure. A thickness difference (D2-D1) between the tunnel oxide layer on the top surface of the outermost first substructure and the tunnel oxide layer on a side surface of the outermost substructure is less than or equal to 0.15 nm. The thickness difference may be 0.14 nm, 0.13 nm, 0.12 nm, 0.11 nm, 0.10 nm, 0.09 nm, 0.08 nm, 0.07 nm, 0.06 nm, 0.05 nm, 0.04 nm or the like. When the tunnel oxide layer on the top surface of the outermost first substructure and the tunnel oxide layer on the side surface of the outermost substructure are excessively large, the thickness of the tunnel oxide layer has poor uniformity, a current density of the solar cell may be affected, and the open-circuit voltage of the solar cell decreases.

In S50, a polycrystalline silicon layer is formed on a surface of the tunnel oxide layer, and the polycrystalline silicon layer is doped to form a doped conductive layer, a conductivity type of the doped conductive layer is the same as that of the semiconductor substrate.

In some embodiments, the polycrystalline silicon layer is deposited on the surface of the tunnel oxide layer by any one of physical vapor deposition, chemical vapor deposition, plasma enhanced chemical vapor deposition and atomic layer deposition. The chemical vapor deposition may be low-pressure chemical vapor deposition or atmospheric chemical vapor deposition.

In an embodiment, the deposition of the tunnel oxide layer and the polycrystalline silicon layer and the doping of the polycrystalline silicon layer are all performed in a low-pressure chemical vapor deposition device.

Firstly, the alkali-polished semiconductor substrate is placed in a deposition device, an oxygen source (e.g. oxygen, nitrous oxide, or ozone) of 20 L to 60 L is introduced, and the deposition device is heated to 560° C. to 620° C. according to a heating rate ranging from 0.5° C./min to 3° C./min for a deposition time ranging from 3 min to 10 min to form the tunnel oxide layer 30.

After the introduction of the oxygen, a constant temperature phase is reached, and then an appropriate amount of silane is introduced to form a polycrystalline silicon layer.

Finally, the polycrystalline silicon layer is doped in situ to form the doped conductive layer 40.

In some embodiments, the doped conductive layer 40 may be a doped polycrystalline silicon layer. The doped conductive layer 40 and the semiconductor substrate have doping elements of a same conductivity type.

In other embodiments, a microcrystalline silicon layer or an amorphous silicon layer may also be deposited on the surface of the tunnel oxide layer 30 and doped in situ to form a doped microcrystalline silicon layer or doped amorphous silicon layer, that is, the doped conductive layer 40.

When the semiconductor substrate 10 is an N-type monocrystalline silicon, the doped conductive layer 40 is an N-type doped polycrystalline silicon layer, an N-type doped microcrystalline silicon layer or an N-type doped amorphous silicon layer, and the doping element may be an N-type doping element such as phosphorus.

In some embodiments, the doped conductive layer 40 has a thickness ranging from 60 nm to 200 nm. For example, as an N-type doped polycrystalline silicon layer, the doped conductive layer 40 has a refractive index ranging from 3.5 to 4.5.

Subsequent to S50 and prior to S60, the method further includes: performing high-temperature annealing treatment and cleaning treatment after the doped polycrystalline silicon layer is deposited in situ.

Embodiments of the present disclosure does not limit how the high-temperature annealing treatment and the cleaning treatment are performed. Illustratively, the high-temperature annealing treatment deals with the deposited polycrystalline silicon layer, which enables the polycrystalline silicon layer to better crystalize. An annealing temperature ranges from 700° C. to 1000° C.

Through the high-temperature annealing treatment, diffused pentavalent phosphorus atoms form the doped polycrystalline silicon layer. After the annealing treatment, a microcrystalline silicon phase of the crystalline silicon is transformed into a polycrystalline silicon phase, and phosphorus is deposited on the surface of the semiconductor substrate to form phosphorosilicate glass (PSG).

The cleaning treatment is intended to remove a phosphorosilicate glass (PSG) layer formed during the phosphorus doping. Due to the high concentration of phosphorus on the surface of the semiconductor substrate, a phosphorosilicate glass (PSG) layer is generally formed during phosphorus diffusion. This phosphorosilicate glass layer has a metal impurity absorption effect, may adversely affect the normal operation of the solar cell, and shall be removed.

In an embodiment, the rear surface of the semiconductor substrate may be placed downward in a chain pickling device (the chain device is at a tape speed of 1.0/min to 2.0 m/min). The semiconductor substrate enters an acid tank to etch away the phosphorosilicate glass (PSG) layer formed on the rear surface by phosphorus diffusion. The acid tank is provided with a prepared mixed acid. The mixed acid includes hydrogen fluoride with a mass concentration of 2% to 10% and hydrogen chloride with a mass concentration of 2% to 10%. A pickling temperature ranges from 15° C. to 25° C., and a pickling time ranges from about 30 seconds to 60 seconds. The front surface of the semiconductor substrate is covered with a water film, and the borosilicate glass (BSG) layer on the front surface of the semiconductor substrate may also be used as a protective layer. During the removal of the phosphorosilicate glass (PSG) layer, reaction of the front surface of the semiconductor substrate with the mixed acid is prevented.

It shall be noted that a washing process is needed after the pickling. A washing time ranges from 10 seconds to 20 seconds, and a washing temperature may range from 15° C. to 25° C. In an embodiment, the semiconductor substrate may also be dried after washing.

In S60, a first passivation layer is formed on the front surface of the semiconductor substrate.

In some embodiments, the first passivation layer 20 may be deposited by plasma enhanced chemical vapor deposition. It is appreciated that, other methods such as organic chemical vapor deposition may also be used. Embodiments of the present disclosure does not limit implementations of the first passivation layer 20.

The first passivation layer 20 may have, but is not limited to, a monolayer or laminated structure of a silicon nitride layer, a silicon oxynitride layer, a silicon oxide layer and the like. It is appreciated that, the first passivation layer may also be other types of passivation layers. The present disclosure does not limit a specific material of the first passivation layer. For example, in other embodiments, the first passivation layer may also have a stacked structure of silicon dioxide and silicon nitride. The first passivation layer can have a good passivation effect on the semiconductor substrate, which helps to improve the conversion efficiency of the solar cell.

In S70, a second passivation layer is formed on a surface of the doped conductive layer.

The second passivation layer 50 may be deposited by plasma enhanced chemical vapor deposition. It is appreciated that, other methods such as organic chemical vapor deposition may also be used. Embodiments of the present disclosure does not limit implementations of the second passivation layer 50.

As an optional technical solution of the present disclosure, the second passivation layer 50 includes at least one of a silicon nitride layer, a silicon oxide layer and a silicon oxynitride layer. The second passivation layer 50 has a thickness ranging from 70 nm to 120 nm. For example, the second passivation layer 50 is a silicon nitride layer. The silicon nitride layer has a low silicon to nitrogen ratio, and the silicon nitride layer has a refractive index ranging from 1.7 to 2.1, which may be 1.7, 1.8, 1.9, 2.0, 2.1 or the like, and may also be other values in the above range, which is not limited herein. The refractive index of the silicon nitride layer is controlled to enable the silicon nitride layer to possess low silicon to nitrogen ratio, so that contact resistivity can be reduced during metallization of the second passivation layer 50 formed, so as to further reduce the contact resistivity of the solar cell.

In some embodiments, when the second passivation layer 50 has a stacking structure of a silicon nitride layer and a silicon oxide layer or a stacking structure of a silicon nitride layer and a silicon oxynitride layer, the silicon nitride layer is located on a surface of the doped conductive layer, and the silicon oxide layer or the silicon oxynitride layer is located on a surface of the silicon nitride layer.

Further, subsequent to S70, the method further includes: screen-printing and sintering the semiconductor substrate to form an electrode.

In some embodiments, the solar cell further includes a first electrode 60 and a second electrode 70. The first electrode 60 passes through the first passivation layer 20 to form ohmic contact with the P-type doped layer (for example, the boron-doped diffusion layer) on the front surface of the semiconductor substrate 10. The second electrode 70 passes through the second passivation layer 50 to form ohmic contact with the doped conductive layer 40. The doped conductive layer 40 and the tunnel oxide layer 30 form a passivated contact structure. The first electrode 60 and the second electrode 70 may be formed by sintering a metal conductive paste coated on surfaces of the first passivation layer and the second passivation layer. In some embodiments, the first electrode 60 or the second electrode 70 is made of a metal material such as silver, aluminum, copper or nickel.

Embodiments 1 to 13 and Comparative Examples 1 to 4 of the solar cell manufactured according to the above method are illustrated as below. Parameters are shown in Table 1.

TABLE 1

Parameters of the solar cell

| Sample | Second texture structure: Distance between a top and a bottom of a pyramid-shaped microstructure (μm) | First texture structure: Distance between a top surface and a bottom surface of a first sub-structure (μm) | First texture structure: One-dimensional size of the top surface of the outermost first sub-structure (μm) | Thickness of the tunnel oxide layer (nm) | Thickness difference between tunnel oxide layers (nm) | First passivation layer | Thickness of the first passivation layer (nm) | Refractive index of the first passivation layer | Second passivation layer | Thickness of the second passivation layer (nm) | Refractive index of the second passivation layer |
|---|---|---|---|---|---|---|---|---|---|---|---|
| Embodiment 1 | 3.0 | 1.9 | 8.6 | 1.2 | 0.12 | Aluminum oxide + silicon nitride | 5 + 50 | 1.92 | Silicon nitride | 70 | 1.95 |
| Embodiment 2 | 3.2 | 1.8 | 8.9 | 1.2 | 0.12 | Aluminum oxide + silicon nitride | 5 + 60 | 1.95 | Silicon nitride | 75 | 2.1 |
| Embodiment 3 | 3.1 | 1.7 | 10.2 | 1.15 | 0.11 | Aluminum oxide + silicon nitride | 5 + 65 | 1.94 | Silicon nitride | 78 | 1.9 |
| Embodiment 4 | 4.4 | 1.6 | 11.6 | 1.12 | 0.11 | Aluminum oxide + silicon nitride | 5 + 70 | 1.93 | Silicon nitride | 80 | 2 |
| Embodiment 5 | 3.8 | 1.8 | 12.4 | 1.1 | 0.11 | Aluminum oxide + silicon nitride | 5 + 75 | 1.95 | Silicon nitride | 82 | 2.02 |
| Embodiment 6 | 3.6 | 1.6 | 13.2 | 1.1 | 0.11 | Aluminum oxide + silicon nitride | 5 + 80 | 1.97 | Silicon nitride | 85 | 2.03 |
| Embodiment 7 | 3.5 | 1.7 | 14.5 | 1.1 | 0.10 | Aluminum oxide + silicon nitride | 8 + 85 | 1.98 | Silicon nitride | 88 | 1.98 |
| Embodiment 8 | 3.2 | 1.5 | 12.1 | 1.05 | 0.10 | Aluminum oxide + silicon nitride | 10 + 100 | 1.95 | Silicon nitride | 90 | 1.96 |
| Embodiment 9 | 3.0 | 1.6 | 15.6 | 1.02 | 0.10 | Silicon nitride | 100 | 1.98 | Silicon nitride | 95 | 1.97 |
| Embodiment 10 | 3.0 | 1.5 | 18.2 | 1.0 | 0.10 | Silicon nitride | 105 | 1.96 | Silicon nitride | 98 | 2..07 |
| Embodiment 11 | 2.8 | 1.9 | 24.8 | 0.95 | 0.12 | Silicon nitride | 110 | 1.92 | Silicon nitride | 100 | 1.95 |
| Embodiment 12 | 2.7 | 1.4 | 26.3 | 0.95 | 0.08 | Silicon nitride | 95 | 2.0 | Silicon nitride | 110 | 1.96 |
| Embodiment 13 | 2.8 | 1.5 | 38.4 | 0.9 | 0.08 | Silicon nitride | 90 | 1.95 | Silicon nitride | 120 | 1.97 |
| Comparative Example 1 | 3.0 | 2.5 | 5.5 | 1.3 | 0.18 | Aluminum oxide + silicon nitride | 5 + 50 | 1.92 | Silicon nitride | 70 | 1.95 |
| Comparative Example 2 | 3.0 | / | / | 1.4 | 0.18 | Aluminum oxide + silicon nitride | 5 + 50 | 1.92 | Silicon nitride | 70 | 1.95 |
| Comparative Example 3 | 3.0 | 1.8 | 8.6 | 1.2 | 0.12 | Aluminum oxide + silicon nitride | 5 + 50 | 1.92 | Silicon nitride | 70 | 2.15 |
| Comparative Example 4 | 3.0 | 1.8 | 8.6 | 1.2 | 0.12 | Aluminum oxide + silicon nitride | 5 | 1.52 | Silicon nitride | 70 | 1.95 |

\* i.e., thickness difference between a tunnel oxide layer on a top surface of the outermost first substructure and a tunnel oxide layer on a side surface of the of the outermost first substructure Table 2 shows parameters used in a deposition process of a tunnel oxide layer and a polycrystalline silicon layer thereon of the solar cell in each embodiment and in each comparative example. In the process, the silicon substrate is installed in a low-pressure chemical vapor deposition (LPCVD) device, the device is vacuumed and the temperature is raised, oxide gas (e.g., oxygen) having a loading temperature is added, and a three-stage oxidation process is conducted, in which a first oxidation period of 1.2 minutes is performed in the first stage, a second oxidation period of 1.3 minutes is performed in the second stage, and a third oxidation period of 1.5 minutes is performed in the third stage, so as to form the tunnel oxide layer on the silicon substrate. Then, the oxide gas is exhausted and nitrogen is added to form an atmosphere in the interior of the device, the temperature of the device is raised to a pre-deposition temperature, a silane gas having a loading temperature is added to the tunnel oxide layer of the silicon substrate for deposition, so as to form the polycrystalline silicon layer.

TABLE 2

Deposition parameters of the solar cell

| Sample | Oxygen source gas loading temperature (° C.) | Oxidation temperature 1 (° C.) | Oxidation temperature 2 (° C.) | Oxidation temperature 3 (° C.) | Pre-deposition temperature (° C.) | Deposition temperature for the polycrystalline silicon layer (° C.) | Silane gas loading temperature (° C.) |
|---|---|---|---|---|---|---|---|
| Embodiment 1 | 590 | 590 | 595 | 600 | 620 | 620 | 590 |
| Embodiment 2 | 590 | 595 | 590 | 600 | 620 | 620 | 590 |
| Embodiment 3 | 590 | 595 | 600 | 600 | 620 | 620 | 590 |
| Embodiment 4 | 590 | 590 | 595 | 600 | 625 | 630 | 590 |
| Embodiment 5 | 590 | 595 | 590 | 600 | 625 | 630 | 590 |
| Embodiment 6 | 590 | 595 | 600 | 600 | 625 | 630 | 590 |
| Embodiment 7 | 600 | 608 | 610 | 600 | 620 | 630 | 600 |
| Embodiment 8 | 600 | 610 | 610 | 610 | 625 | 630 | 600 |
| Embodiment 9 | 600 | 605 | 610 | 600 | 625 | 625 | 600 |
| Embodiment 10 | 610 | 600 | 615 | 600 | 620 | 625 | 610 |
| Embodiment 11 | 615 | 610 | 610 | 610 | 625 | 625 | 615 |
| Embodiment 12 | 615 | 610 | 605 | 600 | 620 | 625 | 615 |
| Embodiment 13 | 615 | 610 | 605 | 600 | 620 | 625 | 615 |
| Comparative Example 1 | 590 | 590 | 590 | 590 | 610 | 610 | 605 |
| Comparative Example 2 | 610 | 610 | 610 | 610 | 620 | 620 | 615 |
| Comparative Example 3 | 630 | 630 | 630 | 630 | 650 | 650 | 645 |
| Comparative Example 4 | 590 | 590 | 590 | 590 | 610 | 610 | 605 |

TABLE 3

Test results of the solar cell

| Sample | Open-circuit voltage (mV) | Short-circuit current (A) | Fill factor | Photoelectric conversion efficiency (%) | Contact resistivity (mΩ•cm) |
|---|---|---|---|---|---|
| Embodiment 1 | 710 | 11.06 | 83.51 | 24.52 | 1.26 |
| Embodiment 2 | 710 | 11.05 | 83.04 | 24.36 | 1.25 |
| Embodiment 3 | 710 | 11.04 | 83.54 | 24.49 | 1.28 |
| Embodiment 4 | 710 | 11.11 | 83.41 | 24.61 | 1.27 |
| Embodiment 5 | 712 | 11.1 | 83.43 | 24.66 | 1.31 |
| Embodiment 6 | 712 | 11.08 | 83.39 | 24.60 | 1.30 |
| Embodiment 7 | 712 | 11.09 | 83.51 | 24.66 | 1.29 |
| Embodiment 8 | 712 | 11.12 | 83.04 | 24.59 | 1.32 |
| Embodiment 9 | 688 | 11.11 | 83.46 | 23.86 | 1.28 |
| Embodiment 10 | 689 | 11.1 | 83.14 | 23.78 | 1.27 |
| Embodiment 11 | 687 | 11.08 | 83.27 | 23.70 | 1.28 |
| Embodiment 12 | 688 | 11.04 | 83.04 | 23.59 | 1.26 |
| Embodiment 13 | 686 | 11.05 | 83.06 | 23.55 | 1.29 |
| Comparative Example 1 | 709 | 11.03 | 82.77 | 24.21 | 1.53 |
| Comparative Example 2 | 707 | 11.04 | 82.76 | 24.16 | 1.51 |
| Comparative Example 3 | 710 | 11.04 | 82.645 | 24.23 | 1.54 |
| Comparative Example 4 | 710 | 11.04 | 82.7 | 24.20 | 1.50 |

It can be seen from Embodiment 1 to Embodiment 3 that a distance between the substructures in the first texture structure of the rear surface of the semiconductor substrate is controlled within an ideal range, which can ensure that the roughness of the rear surface of the semiconductor substrate is within an appropriate range, helps to improve the uniformity of the tunnel oxide layer formed on the first texture structure, ensure better performance of the tunnel oxide layer formed, further inhibit a high local doping concentration of the doped conductive layer, reduce contact resistivity, improve the open-circuit voltage of the solar cell, and improve a fill factor and photoelectric conversion efficiency.

In the first texture structure of the solar cell according to Comparative Example 1, in the direction away from the rear surface and perpendicular to the rear surface, a distance between a top surface of the outermost first substructure and a top surface of the first substructure adjacent thereto is less than or equal to 2 μm. The smaller the one-dimensional size of the top surface of the outermost first substructure, the thicker the tunnel oxide layer formed by deposition. The uniformity of the tunnel oxide layer decreases, resulting in a high local doping concentration of the doped conductive layer formed on the surface of the tunnel oxide layer. The contact resistivity is increased compared with that in Embodiment 1, which leads to the reduction of the open-circuit voltage of the solar cell, as well as the reduction of the fill factor and the photoelectric conversion efficiency.

The solar cell according to Comparative Example 2 is not subjected to an alkali-polishing process after texturing, the rear surface has a pyramid-shaped microstructure, and the uniformity of the tunnel oxide layer deposited on the pyramid-shaped microstructure decreases, which easily leads to a high local doping concentration of the doped conductive layer formed on the surface of the tunnel oxide layer. The contact resistivity is increased compared with that in Embodiment 1, which leads to the reduction of the open-circuit voltage of the solar cell, as well as the reduction of the fill factor and the photoelectric conversion efficiency.

Although the solar cell according to Comparative Example 3, through the treatment of the substructure of the first texture structure, inhibits a high local doping concentration of the doped conductive layer, the contact resistivity is difficult to further decrease during the metallization due to the use of a silicon nitride layer with a high silicon to nitrogen ratio. Compared with Embodiment 1, the distance between the substructures in the first texture structure of the rear surface of the semiconductor substrate and the refractive index of the second passivation layer are controlled, and a synergistic effect of the two can better reduce the contact resistivity and improve the open-circuit voltage, the fill factor and the photoelectric conversion efficiency of the solar cell.

Although the solar cell according to Comparative Example 4, through the treatment of the substructure of the first texture structure, inhibits a high local doping concentration of the doped conductive layer, the contact resistivity increases during the metallization due to the use of an aluminum oxide layer and a silicon nitride layer with a lower overall refractive index as the first passivation layer.

The present disclosure has been disclosed as above with preferred embodiments, the present disclosure should not be limited by those embodiments. Any person skilled in the art may make several possible changes and modifications without departing from the conception of the present disclosure. Therefore, the protection scope of the present disclosure should be subject to the scope defined by the claims of the present disclosure.

What is claimed is:

1. A solar cell, comprising:
   a semiconductor substrate, wherein a rear surface of the semiconductor substrate includes non-pyramid-shaped microstructures, the non-pyramid-shaped microstructures include two or more first substructures at least partially stacked on one another, a surface of the first substructure is polygonal, and in a direction away from the rear surface and perpendicular to the rear surface, a distance between a surface of the outermost first substructure and a surface of an adjacent first substructure is equal to or less than 2 μm; and wherein a front surface of the semiconductor substrate includes pyramid-shaped microstructures, the pyramid-shaped microstructures include a top portion away from the front surface of the semiconductor substrate and a bottom portion close to the front surface of the semiconductor substrate, and in a direction away from the front surface and perpendicular to the front surface, a distance between the top portion and the bottom portion of the pyramid-shaped microstructure is less than or equal to 5 μm;
   a first passivation layer located on a front surface of the semiconductor substrate;
   a tunnel oxide layer located on the non-pyramid-shaped microstructures of the rear surface of the semiconductor substrate;
   a doped conductive layer located on a surface of the tunnel oxide layer; and
   a second passivation layer located on a surface of the doped conductive layer.

2. The solar cell according to claim 1, wherein a one-dimensional size of a surface of the outermost first substructure is less than or equal to 45 μm.

3. The solar cell according to claim 1, wherein a shape of the polygonal plane of the first substructure includes at least one of a diamond, a square, a trapezoid, a substantially diamond, a substantially square or a substantially trapezoid.

4. The solar cell according to claim 1, wherein the first passivation layer includes at least one of a silicon oxide layer, an aluminum oxide layer, a silicon nitride layer or a silicon oxynitride layer.

5. The solar cell according to claim 4, wherein the first passivation layer has a thickness ranging from 10 nm to 120 nm.

6. The solar cell according to claim 1, wherein the first passivation layer is a stacked layer of an aluminum oxide layer, a silicon nitride layer and a silicon oxynitride layer.

7. The solar cell according to claim 6, wherein the aluminum oxide layer has a thickness ranging from 2 nm to 10 nm.

8. The solar cell according to claim 6, wherein the silicon nitride layer has a thickness ranging from 40 nm to 80 nm.

9. The solar cell according to claim 6, wherein the silicon oxynitride layer has a thickness ranging from 10 nm to 60 nm.

10. The solar cell according to claim 1, wherein the second passivation layer includes at least one of a silicon nitride layer, a silicon oxide layer or a silicon oxynitride layer.

11. The solar cell according to claim 10, wherein the second passivation layer has a thickness ranging from 70 nm to 120 nm.

12. The solar cell according to claim 1, wherein the tunnel oxide layer includes at least one of a silicon oxide layer, an aluminum oxide layer, a silicon oxynitride layer, a molybdenum oxide layer or a hafnium oxide layer.

13. The solar cell according to claim 12, wherein the tunnel oxide layer has a thickness ranging from 0.8 nm to 2 nm.

14. The solar cell according to claim 1, wherein a thickness of the tunnel oxide layer on a top surface of the outermost first substructure is less than a thickness of the tunnel oxide layer on a side surface of the outermost first substructure.

15. The solar cell according to claim 14, wherein a thickness difference between the tunnel oxide layer on the top surface of the outermost first substructure and the tunnel oxide layer on a side surface of the outermost substructure is less than or equal to 0.15 nm.

16. The solar cell according to claim 1, wherein a band gap width of the tunnel oxide layer is greater than 3.0 eV.

17. The solar cell according to claim 1, wherein the doped conductive layer has a thickness ranging from 60 nm to 200 nm.

18. A photovoltaic module, comprising:
a plurality of solar cell strings, wherein each of the plurality of solar cell strings comprises solar cells, and at least one of the solar cells comprises:
a semiconductor substrate, wherein a rear surface of the semiconductor substrate includes non-pyramid-shaped microstructures, the non-pyramid-shaped microstructures include two or more first substructures at least partially stacked on one another, a surface of the first substructure is polygonal, and in a direction away from the rear surface and perpendicular to the rear surface, a distance between a surface of the outermost first substructure and a surface of an adjacent first substructure is equal to or less than 2 μm; and wherein a front surface of the semiconductor substrate includes pyramid-shaped microstructures, the pyramid-shaped microstructures include a top portion away from the front surface of the semiconductor substrate and a bottom portion close to the front surface of the semiconductor substrate, and in a direction away from the front surface and perpendicular to the front surface, a distance between the top portion and the bottom portion of the pyramid-shaped microstructure is less than or equal to 5 μm;
a first passivation layer located on a front surface of the semiconductor substrate;
a tunnel oxide layer located on the non-pyramid-shaped microstructures of the rear surface of the semiconductor substrate;
a doped conductive layer located on a surface of the tunnel oxide layer; and
a second passivation layer located on a surface of the doped conductive layer.

19. The photovoltaic module according to claim 18, wherein a one-dimensional size of a surface of the outermost first substructure is less than or equal to 45 μm.

20. The photovoltaic module according to claim 18, wherein a shape of the polygonal plane of the first substructure includes at least one of a diamond, a square, a trapezoid, a substantially diamond, a substantially square or a substantially trapezoid.

* * * * *